United States Patent
Kato et al.

(10) Patent No.: US 12,186,855 B2
(45) Date of Patent: Jan. 7, 2025

(54) POLISHING PAD, METHOD FOR MANUFACTURING POLISHING PAD, AND POLISHING METHOD

(71) Applicant: KURARAY CO., LTD., Kurashiki (JP)

(72) Inventors: Mitsuru Kato, Kurashiki (JP); Hirofumi Kikuchi, Kurashiki (JP); Chihiro Okamoto, Kurashiki (JP); Shinya Kato, Tokyo (JP)

(73) Assignee: KURARAY CO., LTD., Kurashiki (JP)

( * ) Notice: Subject to any disclaimer, the term of this patent is extended or adjusted under 35 U.S.C. 154(b) by 456 days.

(21) Appl. No.: 17/617,118

(22) PCT Filed: Jun. 4, 2020

(86) PCT No.: PCT/JP2020/022213
§ 371 (c)(1),
(2) Date: Dec. 7, 2021

(87) PCT Pub. No.: WO2020/255744
PCT Pub. Date: Dec. 24, 2020

(65) Prior Publication Data
US 2022/0226962 A1    Jul. 21, 2022

(30) Foreign Application Priority Data
Jun. 19, 2019   (JP) ................................. 2019-114147

(51) Int. Cl.
*B24B 37/24* (2012.01)
*B24B 37/26* (2012.01)
*B24B 53/017* (2012.01)

(52) U.S. Cl.
CPC .............. *B24B 37/24* (2013.01); *B24B 37/26* (2013.01); *B24B 53/017* (2013.01)

(58) Field of Classification Search
CPC ......... B24B 37/20; B24B 37/22; B24B 37/24; B24B 37/26
See application file for complete search history.

(56) References Cited

U.S. PATENT DOCUMENTS 5,212,910 A * 5/1993 Breivogel ............... B24B 37/26
451/527
5,216,843 A * 6/1993 Breivogel ............... B24B 37/26
451/36

(Continued)

FOREIGN PATENT DOCUMENTS

JP   H08-511210 A   11/1996
JP   2002144220 A   5/2002

(Continued)

OTHER PUBLICATIONS

International Search Report issued Aug. 4, 2020 in PCT/JP2020/022213 (with English translation), 5 pages.

*Primary Examiner* — Joel D Crandall
(74) *Attorney, Agent, or Firm* — Element IP, PLC

(57) ABSTRACT

Disclosed is a polishing pad including a polishing layer having a polishing surface, wherein the polishing surface includes a deep-groove region having a first pattern formed by a deep groove or hole having a depth of 0.3 mm or more, and a land region that is a region other than the deep-groove region, and the land region includes shallow recesses having a second pattern and a depth of 0.01 to 0.1 mm, and a plurality of island-like land portions surrounded by the shallow recesses and having a maximum distance in a horizontal direction of 8 mm or less.

20 Claims, 9 Drawing Sheets

(56) References Cited

U.S. PATENT DOCUMENTS

| | | | |
|---|---|---|---|
| 5,441,598 A * | 8/1995 | Yu | B24B 37/26 438/692 |
| 5,489,233 A * | 2/1996 | Cook | B24D 11/005 51/299 |
| 6,165,904 A * | 12/2000 | Kim | B24B 37/11 438/692 |
| 6,641,471 B1 | 11/2003 | Pinheiro et al. | |
| 6,749,714 B1 * | 6/2004 | Ishikawa | B24B 37/205 156/345.12 |
| 7,226,345 B1 * | 6/2007 | Dornfeld | B24B 37/26 451/287 |
| 7,357,703 B2 * | 4/2008 | Nishimura | B24B 37/30 451/526 |
| 7,544,115 B2 * | 6/2009 | O'Moore | B24B 37/26 451/550 |
| 8,123,597 B2 * | 2/2012 | Chiu | B24B 37/26 451/527 |
| 8,647,178 B2 * | 2/2014 | Min | B24B 37/26 451/527 |
| 9,457,449 B1 * | 10/2016 | Brugarolas Brufau | B24B 37/26 |
| 9,649,742 B2 * | 5/2017 | Lefevre | B24B 37/22 |
| 10,040,167 B2 * | 8/2018 | Chen | B24B 37/22 |
| 10,160,092 B2 * | 12/2018 | Lefevre | B24B 37/26 |
| 11,633,830 B2 * | 4/2023 | Guzman | B24B 37/205 451/41 |
| 2003/0199234 A1 | 10/2003 | Chen et al. | |
| 2007/0049168 A1 * | 3/2007 | Fujita | B24B 53/017 451/6 |
| 2007/0149096 A1 * | 6/2007 | Nishimura | B24B 37/26 451/527 |
| 2008/0003935 A1 * | 1/2008 | Feng | B24B 37/26 451/527 |
| 2008/0085661 A1 | 4/2008 | Hsu et al. | |
| 2009/0191795 A1 * | 7/2009 | Kuwabara | C08L 75/16 451/526 |
| 2010/0009612 A1 | 1/2010 | Park et al. | |
| 2010/0105303 A1 * | 4/2010 | Chiu | B24B 37/26 451/548 |
| 2014/0206268 A1 | 7/2014 | Lefevre et al. | |
| 2016/0136787 A1 * | 5/2016 | Bajaj | B33Y 70/00 51/298 |
| 2016/0375544 A1 * | 12/2016 | Kozhukh | B24B 37/24 451/527 |
| 2016/0375555 A1 * | 12/2016 | Veneziale | B24D 18/0009 51/298 |
| 2017/0036319 A1 * | 2/2017 | Chen | B24B 37/26 |
| 2017/0173758 A1 * | 6/2017 | Lehuu | B24B 7/241 |
| 2017/0274496 A1 * | 9/2017 | Cook | B24B 37/26 |
| 2019/0389033 A1 * | 12/2019 | Yun | B24B 37/22 |

FOREIGN PATENT DOCUMENTS

| | | |
|---|---|---|
| JP | 2010253665 A | 11/2010 |
| JP | 2012210709 A | 11/2012 |
| JP | 2014038916 A | 2/2014 |
| JP | 2016506307 A | 3/2016 |
| TW | 567121 B | 12/2003 |
| TW | 200810878 A | 3/2008 |

* cited by examiner

[FIG. 1A]
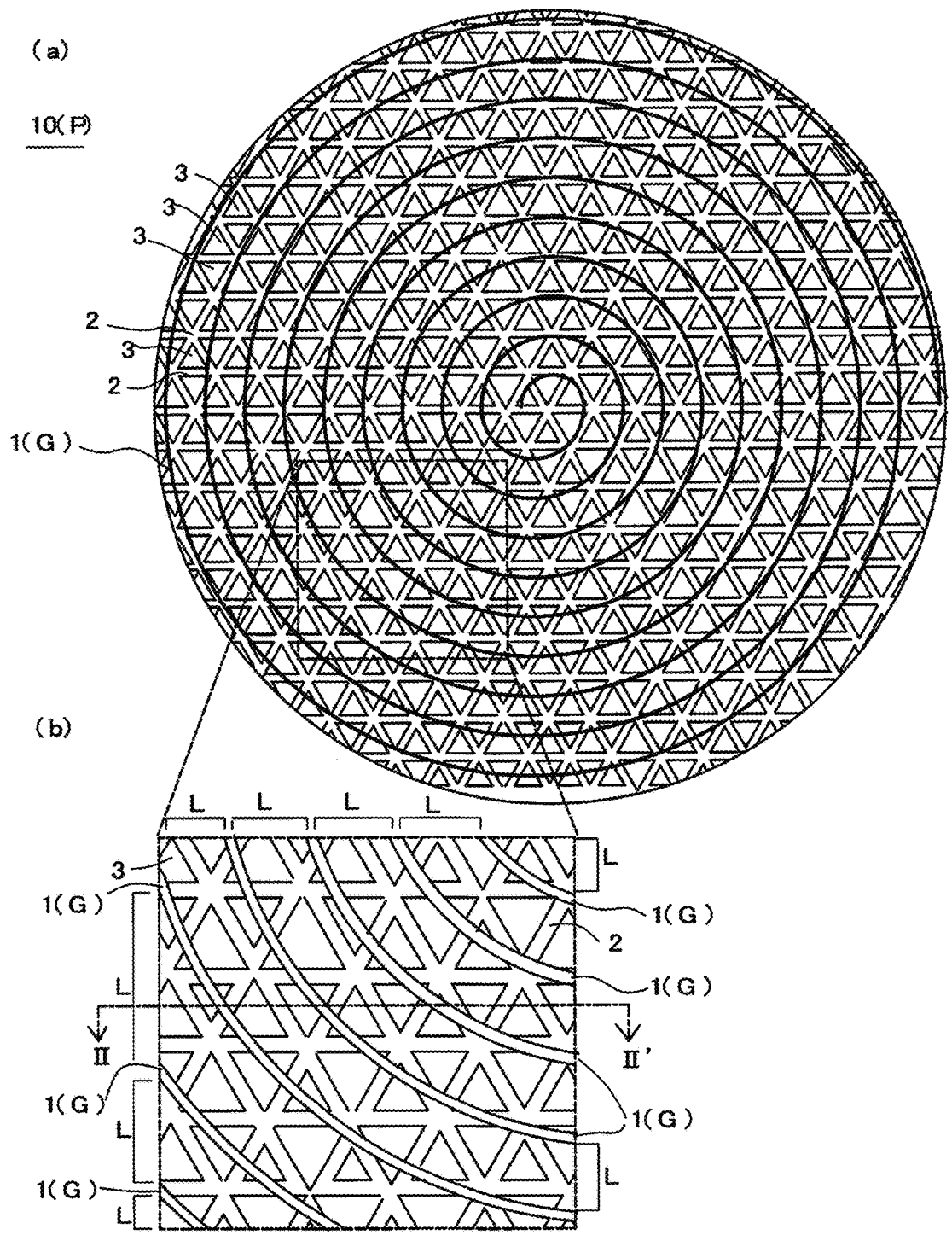

[FIG. 1B]
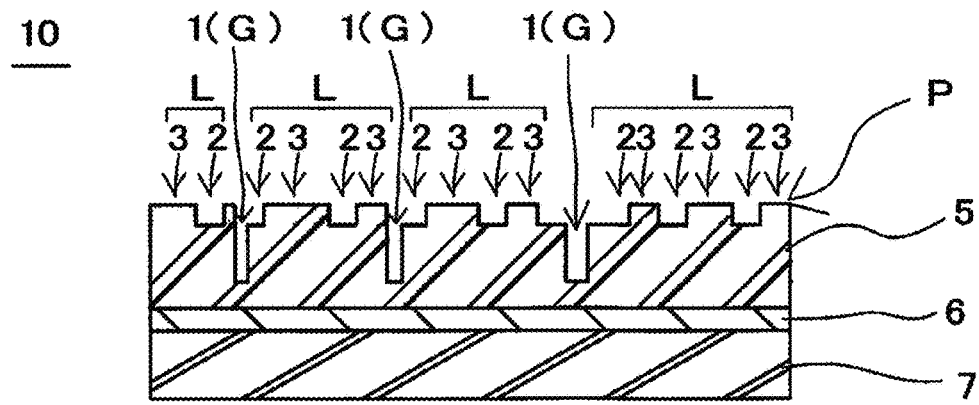
[FIG. 2]
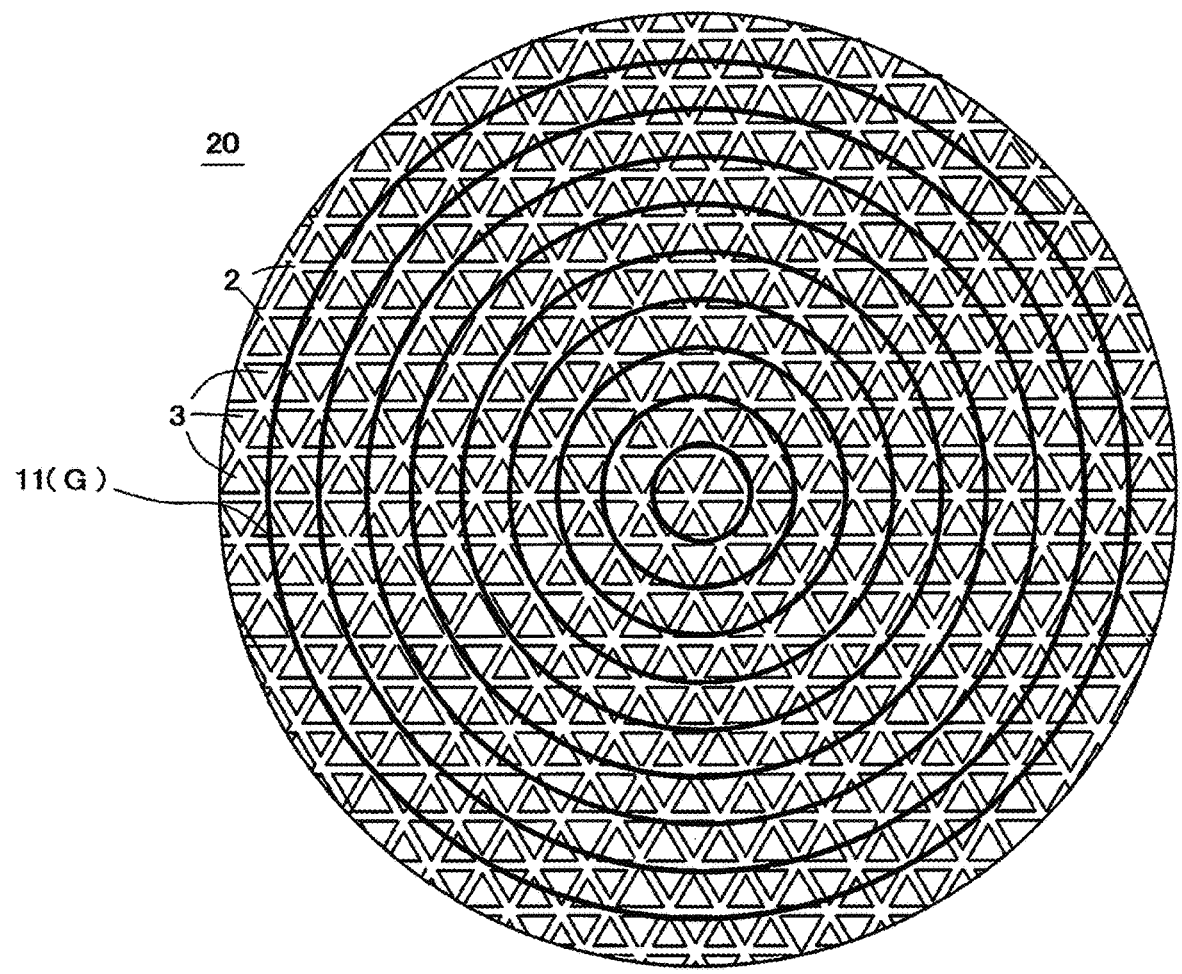

[FIG. 3A]
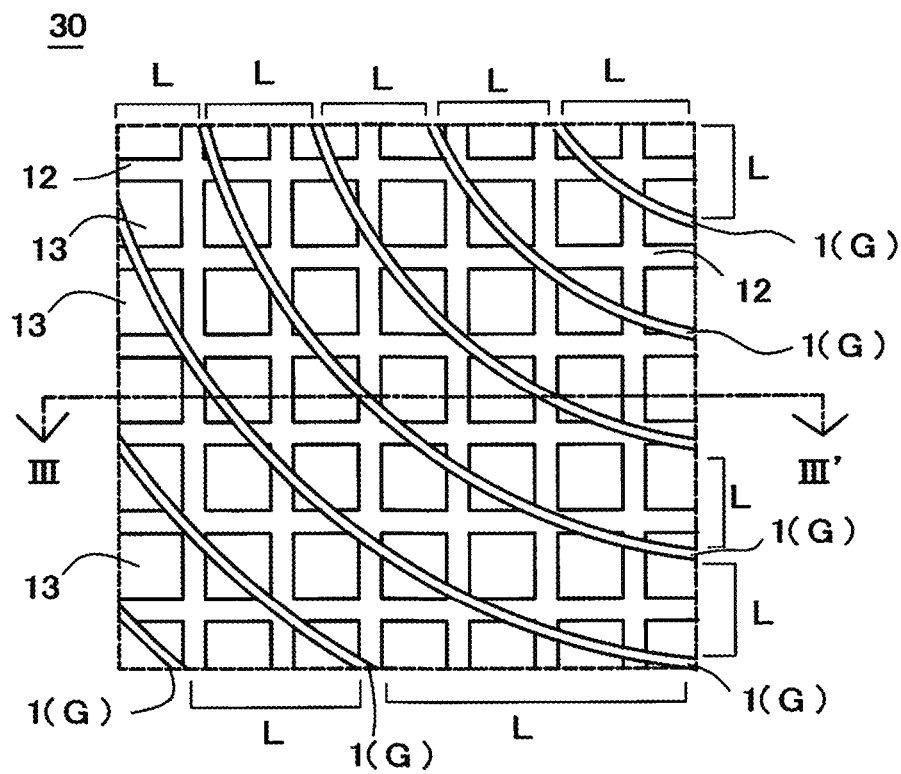
[FIG. 3B]
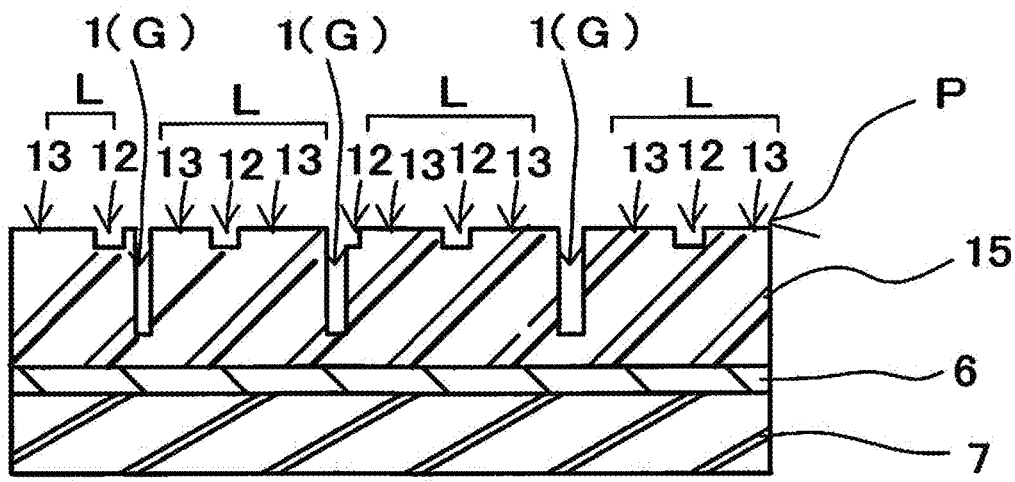

[FIG. 4]
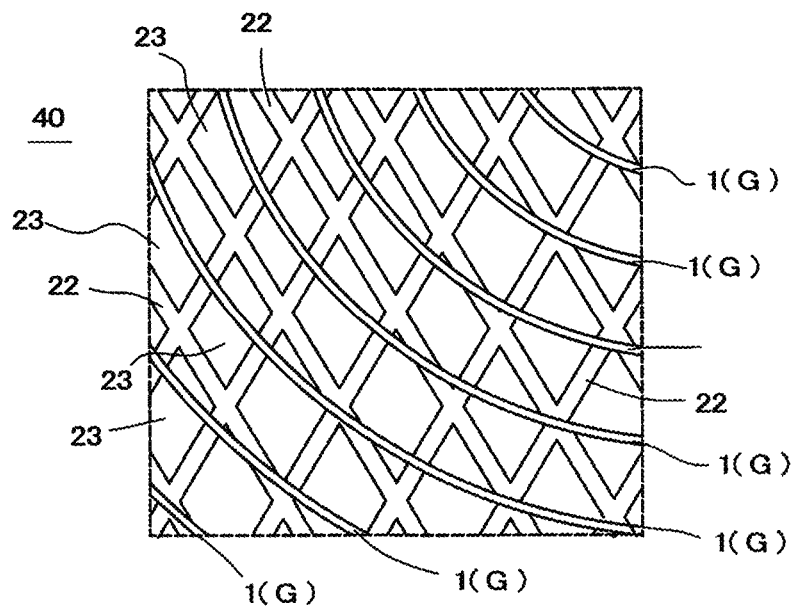
[FIG. 5]
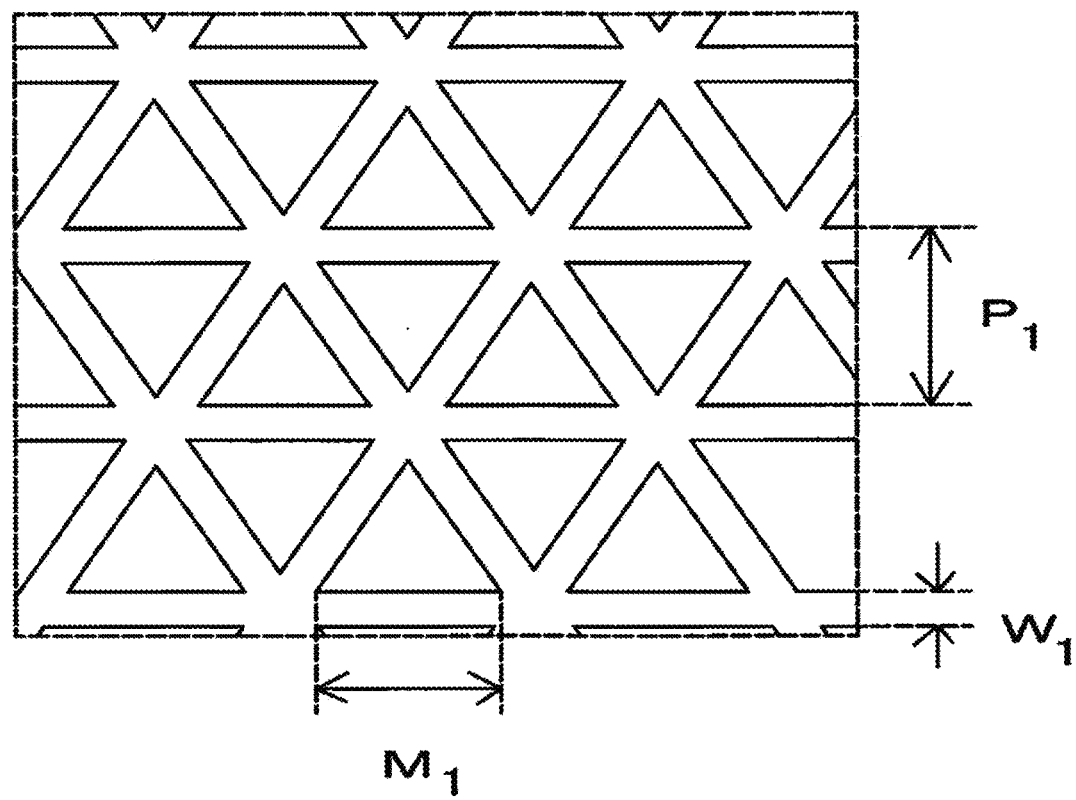

[FIG. 6]
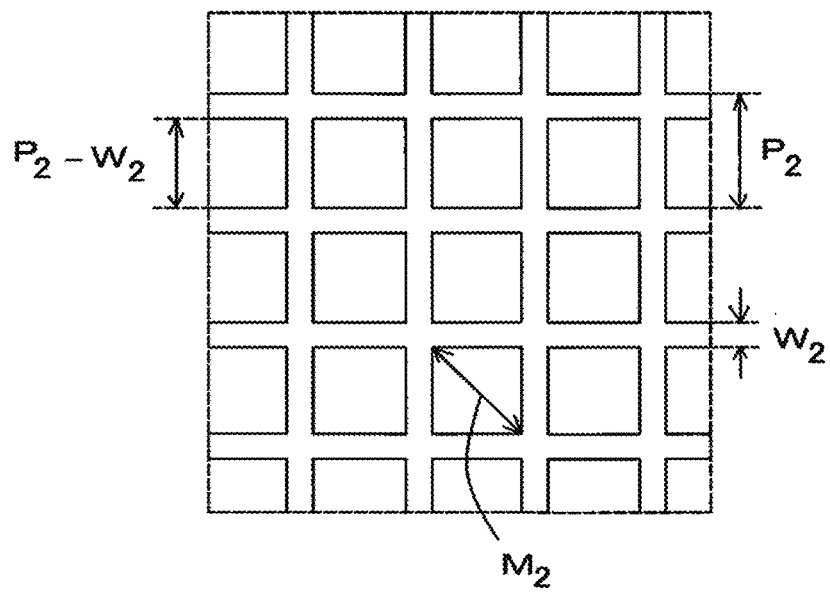
[FIG. 7]
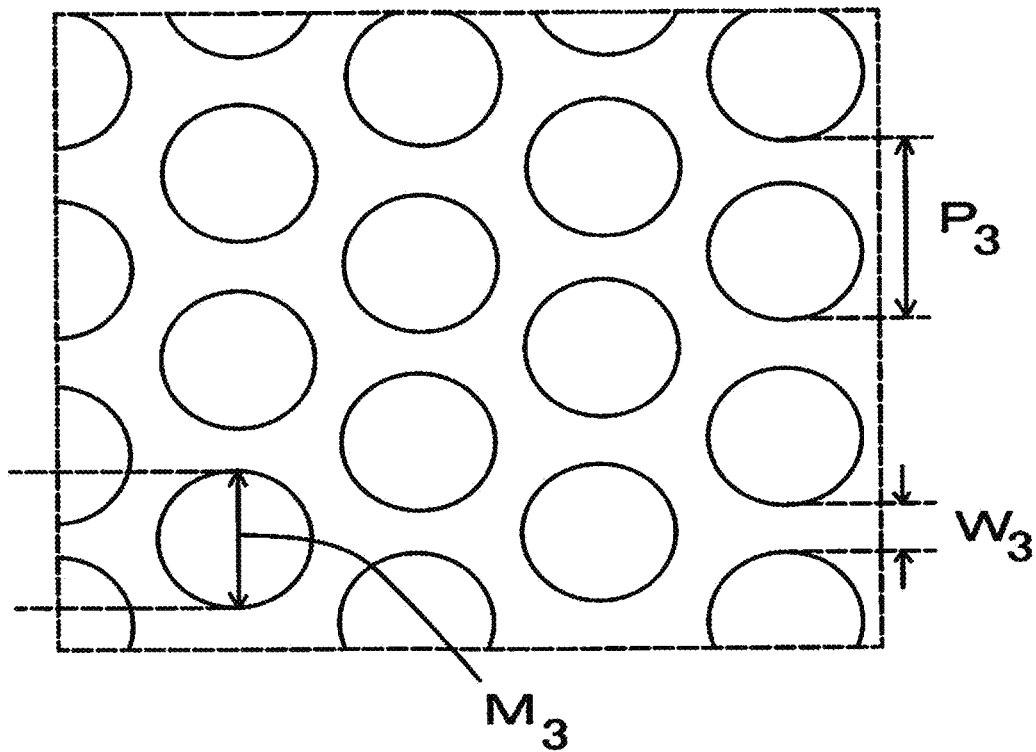

[FIG. 8]
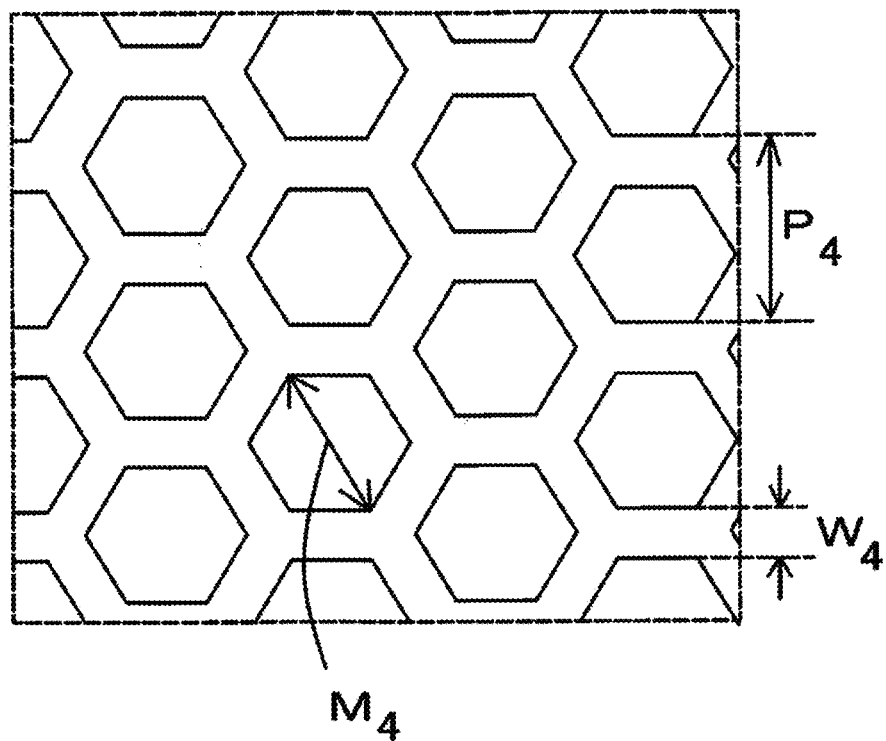
[FIG. 9]
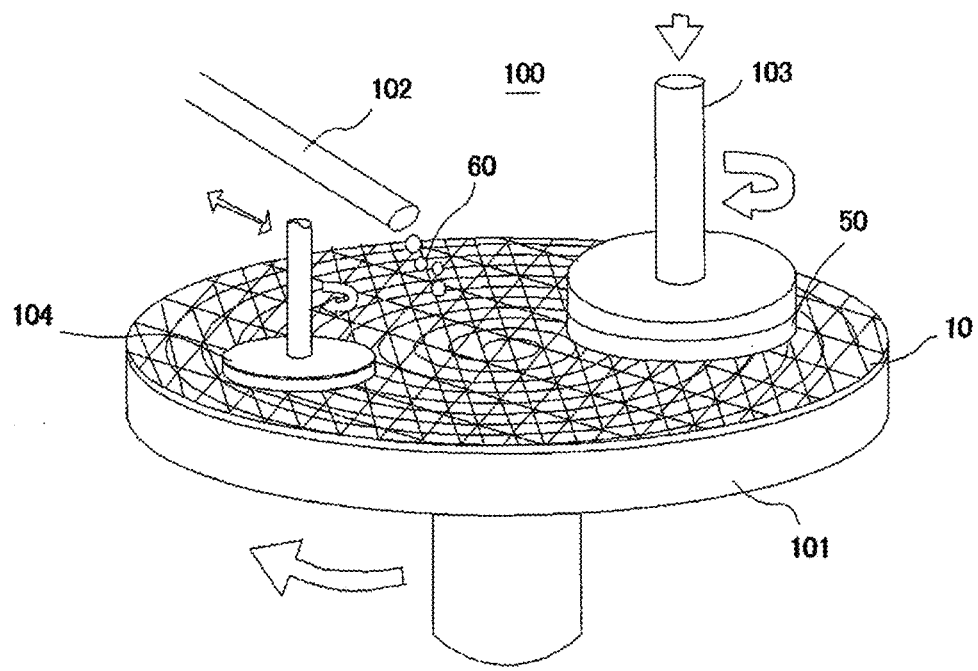

[FIG. 10A]
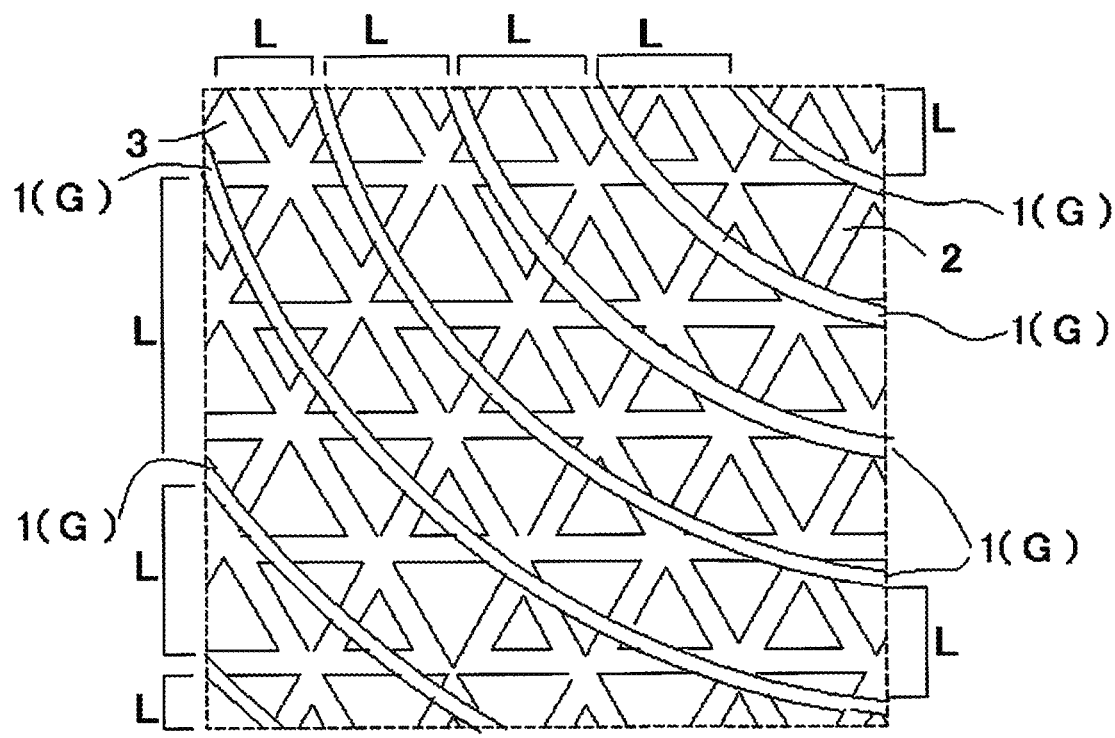
[FIG. 10B]
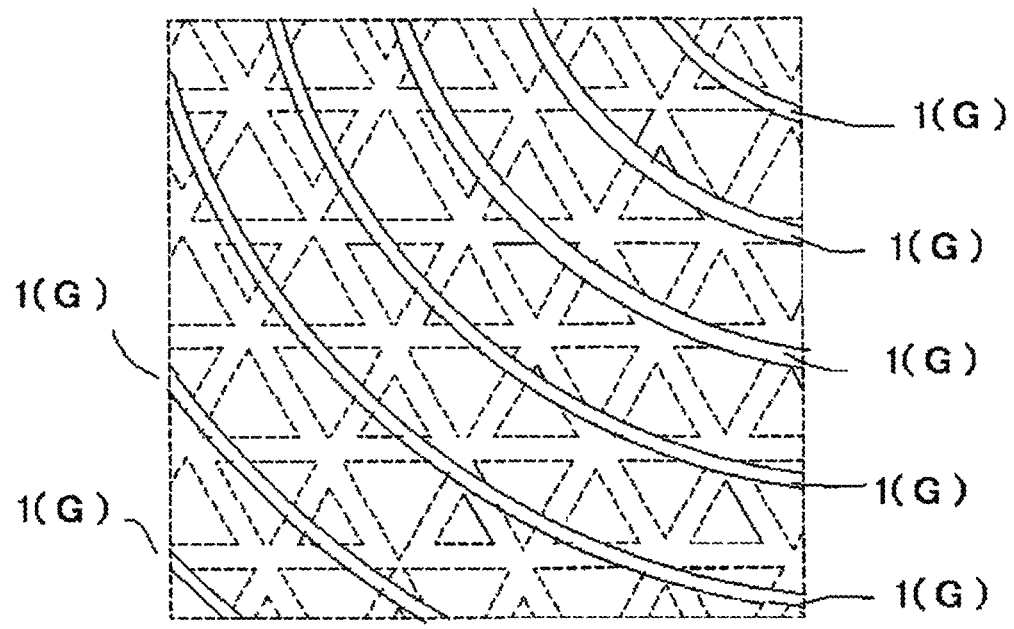

[FIG. 11]
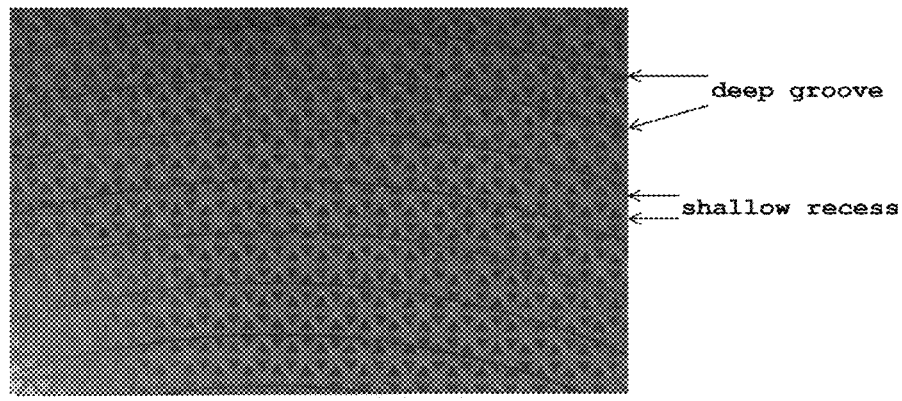
[FIG. 12]
[FIG. 13]
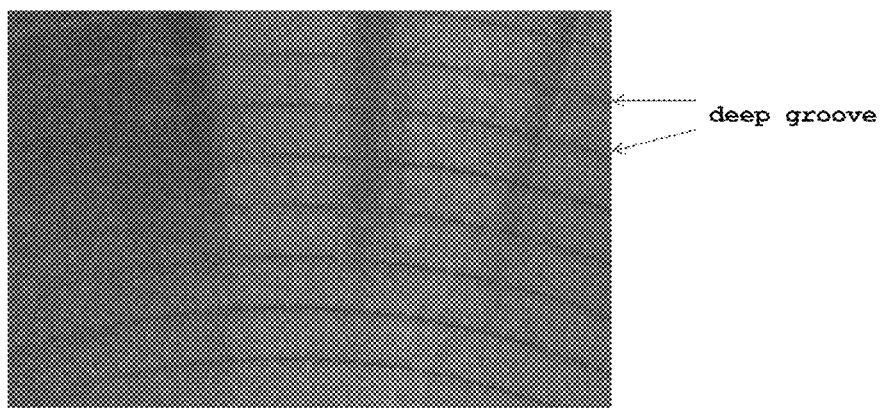

[FIG. 14]
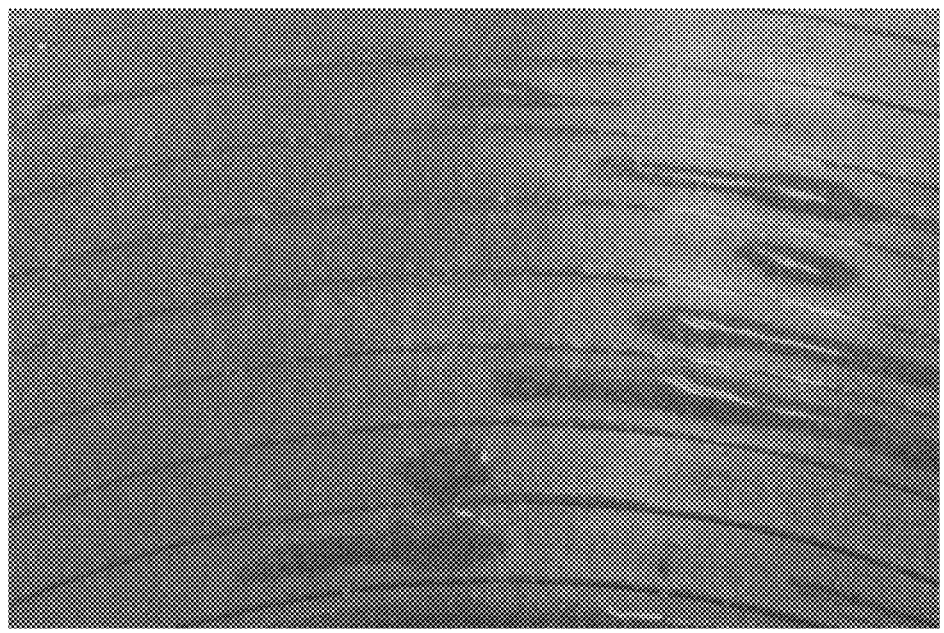

POLISHING PAD, METHOD FOR MANUFACTURING POLISHING PAD, AND POLISHING METHOD

TECHNICAL FIELD

The present invention relates to a polishing pad that can reduce the time required for roughening a polishing surface of a polishing pad to a roughness suitable for polishing.

BACKGROUND ART

Conventionally, chemical mechanical polishing (CMP), which involves polishing a surface to be polished while supplying a slurry to the polishing surface of a polishing pad, has been used in order to mirror-finish substrate materials of a semiconductor and a silicon wafer, a hard disk, a liquid crystal display, or glass which is a material of a lens, and to planarize irregularities caused by an insulating film or a metal film in the manufacturing process of semiconductor devices.

As a polishing pad for CMP, a non-woven fabric-type polishing pad, a polishing pad composed mainly of a polymer foam having a closed-cell structure, a polishing pad composed mainly of a non-foamed polymer body, and the like are known. The non-woven fabric-type polishing pad has an advantage of good contact with a base material to be polished due to its flexibility, but at the same time has a disadvantage of poor planarization performance for planarizing the surface to be polished due to its flexibility. The polishing pad composed mainly of a polymer foam having a closed-cell structure has an advantage of superior planarization performance because of having a higher hardness than that of the non-woven fabric-type polishing pad, but at the same time has a disadvantage that it is difficult to achieve higher planarization performance through a further increase in the hardness of the polishing layer. On the other hand, the polishing pad composed mainly of a non-foamed polymer body can achieve high planarization performance. In addition, the polishing pad composed mainly of a non-foamed polymer body also has an advantage of a longer life of the polishing pad due to its higher abrasion resistance than that of the polishing pad composed mainly of a polymer foam, and an advantage that differences in polishing characteristics due to variation in foaming are less likely to occur. For example, PTL 1 listed below discloses a high-hardness polishing pad composed mainly of a non-foamed polyurethane.

In CMP, prior to using a new, unused polishing pad, conditioning called "break-in" for forming a roughness suitable for polishing by finely roughening the polishing surface of the polishing pad using a pad conditioner (also called a "dresser") is usually performed. By conditioning the polishing surface prior to using an unused polishing pad, the slurry retention of the polishing surface is improved.

During break-in of the polishing pad, a polishing device cannot be operated. Therefore, there is demand to increase the operating time of the polishing device by reducing the time required for break-in (hereinafter also referred to as "break-in time"). By increasing the operating time of the polishing device, the production costs of a semiconductor device and the like are reduced.

Several techniques for reducing the break-in time have been proposed. For example, PTL 2 listed below discloses a polishing pad including a polishing surface on which a microtexture having a specific roughness parameter is formed in advance. PTL 2 discloses that using such a polishing pad can reduce the break-in time.

PTL 3 listed below discloses a method for manufacturing a polishing sheet including a sheet-shaped foam, wherein, in the step of adjusting the thickness of the polishing sheet by sanding with sandpaper, the sanding with sandpaper of a polishing surface includes two stages: a first finish grinding and a second finish grinding, the first finish grinding is performed with a larger grit number of sandpaper, the grit number of sandpaper used for the second finish grinding is smaller than the grit number of sandpaper used at the end of the first finish grinding, and a total grinding amount of the second finish grinding is 10 μm or more and 1000 μm or less. According to the manufacturing method of PTL 3, it is disclosed that a polishing pad that requires a shorter time to start up when performing CMP, and that has excellent in-plane uniformity can be obtained.

PTL 4 listed below discloses a polishing pad used for polishing an object to be polished, including a polishing surface pressed onto the object to be polished, wherein corrugations on the polishing surface have a cycle in the range of 5 mm to 200 mm and a largest amplitude of 40 μm or less, and the minus zeta potential of the polishing surface is greater than or equal to −50 mV and less than 0 mV. PTL 4 discloses that, with such a polishing pad, repulsion against the minus abrasive particles of slurry is controlled, and the affinity between the slurry and the polishing surface of the polishing pad becomes better, as a result of which the break-in time can be reduced.

Meanwhile, PTL 5 listed below discloses a polishing pad for polishing a substrate, including a polishing body having a polishing side opposite a back surface, and a polishing surface including a plurality of cylindrical protrusions continuous with the polishing side of the polishing body. Also, PTL 5 describes that the height of each of the cylindrical protrusions is approximately in the range of 0.5 to 1 millimeter. However, PTL 5 does not mention the reduction of the break-in time.

CITATION LIST

Patent Literatures

[PTL 1] Japanese Laid-Open Patent Publication No. 2014-038916
[PTL 2] Japanese Laid-Open Patent Publication No. 2002-144220
[PTL 3] Japanese Laid-Open Patent Publication No. 2010-253665
[PTL 4] Japanese Laid-Open Patent Publication No. 2012-210709
[PTL 5] Japanese Unexamined Patent Publication (Translation of PCT Application) No. 2016-506307

SUMMARY OF INVENTION

Technical Problem

For example, the polishing pad disclosed in the PTL 2, which has a polishing surface including a microtexture having a specific roughness parameter, has a problem in that the break-in time cannot be sufficiently reduced. For example, when a concentric or spiral microtexture perpendicularly intersecting the direction of the diameter of the polishing pad is formed on the polishing surface by cutting, the rotational direction of the polishing pad coincides with the direction of the groove in the case of using a non-foamed polymer body with few surface irregularities as a polishing layer. Accordingly, water flows with rotation of the polishing pad in the same direction therewith, which causes a fluid lubrication state, resulting in the problem that the polishing surface is difficult to be dressed, and the break-in time tends to be increased. On the other hand, PTLs 3 and 4 propose to provide polishing pads for which the break-in time has been reduced by obtaining a more planar polishing pad. However, the polishing pads disclosed in PTLs 3 and 4 need to be manufactured by being sanded with sandpaper, and therefore are difficult to be applied to a polishing pad composed mainly of a non-foamed polymer body having a very high hardness. In addition, buffing powder may remain on the polishing surface, thus making it more likely to cause scratches.

It is an object of the present invention to provide a polishing pad that can reduce the time for roughening a polishing surface of a polishing pad to a roughness suitable for polishing.

Solution to Problem

An aspect of the present invention is directed to a polishing pad including a polishing layer having a polishing surface, wherein the polishing surface includes a deep-groove region having a first pattern formed by a deep groove or hole having a depth of 0.3 mm or more, and a land region that is a region other than the deep-groove region, and the land region includes shallow recesses having a second pattern and a depth of 0.01 to 0.1 mm, and a plurality of island-like land portions surrounded by the shallow recesses and having a maximum distance in a horizontal direction of 8 mm or less. The polishing surface is one surface of the polishing layer that is located on the side coming into contact with a surface to be polished of a material to be polished during polishing. The horizontal direction of the land portions means the plane direction of the polishing surface of the polishing pad. With such a polishing pad, it is possible to reduce the break-in time and the time for running-in polishing for bringing the polishing surface of an unused polishing pad into a surface state suitable for polishing. In particular, when the maximum distance in the horizontal direction of the land portions is 8 mm or less, a pad conditioner can easily come into contact with each of the land portions surrounded by the shallow recesses, so that the time for achieving a roughness suitable for polishing can be reduced.

Furthermore, the polishing pad according to the present embodiment can increase the uniformity of the shape and the surface roughness of the polishing surface, and thus facilitates the inspection for checking whether the surface shape falls within specifications on the entire polishing surface. In addition, the shallow recesses can be formed by cutting or the like as will be described below, without buffing the polishing surface with sandpaper. When the shallow recesses are formed by cutting, the step of washing buffing powder in order to prevent generation of scratches due to the residual buffing powder is likely to be omitted.

In the above-described polishing pad, it is preferable that the second pattern includes at least one pattern formed on the entire surface of the land region selected from the group consisting of a triangular grid pattern, a square grid pattern, a rectangular grid pattern, a diamond-shaped grid pattern, and a hexagonal grid pattern. It is preferable that the second pattern is such a pattern, because a pad conditioner easily comes into uniform contact, from all directions, with the plurality of island-like land portions surrounded by the shallow recesses, so that the time for achieving a roughness suitable for polishing can be further reduced. Such a pattern can be formed by a combination of linear shallow recesses, and therefore can be easily formed by cutting.

In the above-described polishing pad, it is preferable that a projected area of each one of the land portions is in the range of 0.3 to 10 mm$^2$. It is preferable that the projected area of the land portions is in such a range, because a pad conditioner can easily come into contact with each of the land portions surrounded by the shallow recesses, so that the time for achieving a roughness suitable for polishing can be further reduced.

In the above-described polishing pad, it is preferable that a ratio of a total projected area of the land portions to an overall projected area of the land region is 10 to 50%. Here, the ratio of the total projected area of the land portions means the ratio of the total of the projected areas of the land portions to the overall projected area when the land region is two-dimensionally projected without taking irregularities of the polishing surface into account. It is preferable that the ratio of the total projected area of the land portions is in such a range, because a pad conditioner can easily come into contact with each of the land portions surrounded by the shallow recess, so that the time for achieving a roughness suitable for polishing can be further reduced.

In the above-described polishing pad, it is preferable that the depth of the shallow recesses is 0.02 to 0.06 mm. It is preferable that the depth of the shallow recesses is in such a range, because the land portions surrounded by the shallow recesses wear out in an even shorter period of time during break-in or running-in polishing, so that the time for achieving a roughness suitable for polishing can be further reduced.

In the above-described polishing pad, it is preferable that a ratio of a projected area of the deep-groove region to an overall projected area of the polishing surface is 5 to 40%, and that the first pattern includes at least one pattern selected from the group consisting of a spiral pattern, a concentric pattern, and a grid pattern, because the slurry can be sufficiently retained.

In the above-described polishing pad, it is preferable that the polishing layer is formed of a sheet composed mainly of a non-foamed polymer body, because a high-hardness polishing layer for achieving a roughness suitable for polishing is likely to be obtained.

In the above-described polishing pad, it is preferable that the polishing layer is formed of a thermoplastic polyurethane sheet, because of the excellent scratch resistance and the ease of molding into a polishing layer.

Another aspect of the present invention is directed to a polishing method for polishing a surface to be polished of a semiconductor device using the above-described polishing pad in a manufacturing process of the semiconductor device, including the step of conditioning the polishing surface under a conditioning condition under which an accumulated conditioning time until an average depth of the shallow recesses becomes less than 0.01 mm is 30 minutes or less, and preferably 1 to 20 minutes.

Advantageous Effects of Invention

According to the present invention, it is possible to reduce the time for roughening the polishing surface of a polishing pad to a roughness suitable for polishing.

BRIEF DESCRIPTION OF DRAWINGS

FIG. 1A is a schematic view of a polishing surface for illustrating a polishing pad 10 according to an embodiment.

FIG. 1B is a schematic cross-sectional view of a polishing layer for illustrating the polishing pad 10 according to the embodiment.

FIG. 2 is a schematic plan view of the polishing surface for illustrating a polishing pad 20 according to another example of the embodiment.

FIG. 3A is a partial enlarged schematic view of a polishing surface for illustrating a polishing pad 30 according to another example of the embodiment.

FIG. 3B is a schematic cross-sectional view of the polishing layer for illustrating the polishing pad 30 according to another example of the embodiment.

FIG. 4 is a partial enlarged schematic view of a polishing surface for illustrating a polishing pad 40 according to another example of the embodiment.

FIG. 5 is an explanatory diagram for illustrating the pitch and the width of shallow recesses in the form of an equilateral triangular grid, and a maximum distance in a horizontal direction of one island-like land portion.

FIG. 6 is an explanatory diagram for illustrating the pitch and the width of shallow recesses in the form of a square grid, and a maximum distance in a horizontal direction of one island-like land portion.

FIG. 7 is an explanatory diagram for illustrating the pitch and the width of shallow recesses surrounding circular land portions arranged in a regular hexagonal grid, and a maximum distance in a horizontal direction of one island-like land portion.

FIG. 8 is an explanatory diagram for illustrating the pitch and the width of shallow recesses surrounding regular hexagonal land portions arranged in a regular hexagonal grid, and a maximum distance in a horizontal direction of one island-like land portion.

FIG. 9 is an explanatory diagram for illustrating CMP.

FIG. 10A is an explanatory diagram for illustrating changes of a polishing surface during break-in.

FIG. 10B is an explanatory diagram for illustrating changes of the polishing surface during break-in.

FIG. 11 is an enlarged photograph of a polishing surface of a polishing pad obtained in Example 1.

FIG. 12 is an enlarged photograph showing a state, during running-in polishing, of the polishing surface of the polishing pad obtained in Example 1.

FIG. 13 is an enlarged photograph of a polishing surface of a polishing pad obtained in Comparative Example 1.

FIG. 14 is an enlarged photograph showing a state, during running-in polishing, of the polishing surface of the polishing pad obtained in Comparative Example 1.

DESCRIPTION OF EMBODIMENT

A polishing pad according to the present embodiment includes a polishing layer having a polishing surface.

As the material for forming the polishing layer, any synthetic or natural polymer material conventionally used for production of polishing layers of polishing pads may be used without any particular limitation. Specific examples of the polymer material for forming the polishing layer include polyurethane, polyethylene, polypropylene, polybutadiene, an ethylene-vinyl acetate copolymer, a butyral resin, polystyrene, polyvinyl chloride, an acrylic resin, an epoxy resin, polyester, and polyamide. These may be used alone or in a combination of two or more. Among these, a polyurethane obtained by reacting a polyurethane raw material containing a polymer diol, an organic diisocyanate, and a chain extender is particularly preferable because a polishing layer that exhibits excellent planarization performance and is less likely to cause scratches can be obtained. In the following, a polyurethane used as a material for forming the polishing layer will be described in detail as a representative example.

Examples of the polymer diol, the organic diisocyanate, and the chain extender constituting the polyurethane raw material include the following compounds.

Specific examples of the polymer diol include polyether diols such as polyethylene glycol and polytetramethylene glycol; polyester diols such as poly(nonamethylene adipate) diol, poly(2-methyl-1,8-octamethylene adipate)diol, and poly(3-methyl-1,5-pentamethylene adipate)diol; and polycarbonate diols such as poly(hexamethylene carbonate)diol and poly(3-methyl-1,5-pentamethylene carbonate)diol, or copolymers thereof. These may be used alone or in a combination of two or more.

Specific examples of the organic diisocyanate include aliphatic or alicyclic diisocyanates such as hexamethylene diisocyanate, isophorone diisocyanate, 4,4'-dicyclohexylmethane diisocyanate, and 1,4-bis(isocyanatomethyl)cyclohexane; and aromatic diisocyanates such as 4,4'-diphenylmethane diisocyanate, 2,4-tolylene diisocyanate, 2,6-tolylene diisocyanate, and 1,5-naphthylene diisocyanate. These may be used alone or in a combination of two or more. Among these, 4,4'-diphenylmethane diisocyanate is preferable, for example, because the resulting polishing layer has excellent abrasion resistance.

Examples of the chain extender include low-molecular weight compounds including, in the molecule, two or more active hydrogen atoms capable of reacting with an isocyanate group, and having a molecular weight of 350 or less. Specific examples thereof include diols such as ethylene glycol, diethylene glycol, 1,3-propanediol, 1,2-butanediol, 1,3-butanediol, 1,4-butanediol, 1,5-pentanedial, neopentyl glycol, 1,6-hexanediol, 3-methyl-1,5-pentanediol, 1,4-bis(β-hydroxyethoxy)benzene, 1,9-nonanediol, and spiroglycol; and diamines such as ethylenediamine, tetramethylene diamine, hexamethylene diamine, nonamethylene diamine, hydrazine, xylylene diamine, isophoronediamine, and piperazine. These may be used alone or in a combination of two or more. Among these, 1,4-butanediol and/or 1,9-nonanediol is particularly preferable.

The blending ratio of the components of the polyurethane raw material is adjusted as appropriate taking into account the properties and the like that are intended to be provided to the polishing layer. Specifically, for example, the components are preferably blended at such a ratio that the isocyanate group contained in the organic polyisocyanate is preferably 0.95 to 1.3 moles, more preferably 0.96 to 1.1 moles, and particularly preferably 0.97 to 1.05 moles, per mole of the active hydrogen atoms contained in the polymer diol and the chain extender. When the amount of the isocyanate group contained in the organic diisocyanate is too small, the mechanical strength and the abrasion resistance of the resulting polyurethane tend to be reduced. When the amount of the isocyanate group contained in the organic diisocyanate is too large, the productivity of the polyurethane and the storage stability of the polyurethane raw material tend to be reduced.

The ratio of nitrogen atoms derived from the isocyanate group of the organic polyisocyanate in the polyurethane is preferably 4.8 to 7.5 mass %, more preferably 5.0 to 7.3 mass %, and particularly preferably 5.2 to 7.1 mass %, because a polishing layer particularly excellent in planarization performance and scratch resistance can be obtained. When the ratio of the nitrogen atoms derived from the isocyanate group is too low, the hardness of the resulting polishing layer tends to be reduced.

It is preferable that the polyurethane used as the material for forming the polishing layer is a thermoplastic polyurethane, because a polishing layer having a high hardness and exhibiting excellent planarization performance can be obtained. Note that thermoplasticity means the properties of being moldable through melting by a heating process such as extrusion molding, injection molding, calendering, and 3D-printer molding. Such a thermoplastic polyurethane is obtained by a known polyurethane manufacturing method such as a prepolymer method or a one-shot method, using the polyurethane raw material containing the polymer diol, the organic diisocyanate, and the chain extender. In particular, a method in which melt-polymerization is performed by melt-kneading the polyurethane raw material substantially in the absence of a solvent, and a method in which continuous melt-polymerization is performed using a multi-screw extruder are preferable because of the excellent productivity.

Examples of the manufacturing method of the polishing layer include, but are not limited to, a method in which a polymer material for polishing layers, which is a composition obtained by blending, to a polymer material for forming the above-described polishing layer, conventionally used additives for polishing layers as needed, is formed into a sheet by a known sheeting method. Specific examples thereof include a method in which the polymer material for polishing layers is formed into a sheet by being melt-extruded using an extruder such as a single-screw extruder or twin-screw extruder equipped with a T-die. Alternatively, the sheet may be manufactured by molding the above-described polymer material for polishing layers into a block shape, and slicing the block-shaped molded body. The obtained sheet is finished into a polishing layer sheet by being processed into the desired dimensions or shape by cutting, punching, machining, or the like, or processed into the desired thickness by grinding or the like.

The D hardness of the polishing layer is preferably 45 to 90, more preferably 50 to 88, and particularly preferably 55 to 85, from the viewpoint of achieving excellent balance between the improvement in the planarization performance and the suppression of generation of scratches on the surface of a base material to be polished.

Preferably, the polishing layer is a polishing layer that has a non-foamed structure, and that is formed of a non-porous sheet having a non-foamed structure. The polishing layer having a non-foamed structure is preferable in that the polishing layer can retain a high hardness, thus exhibiting further excellent planarization performance. Also, the polishing layer having a non-foamed structure is preferable in that no pores are exposed on the surface of the polishing layer, and the abrasive grains contained in a slurry do not agglomerate or agglutinate in the pores, so that scratches are less likely to be generated. In addition, the polishing layer having a non-foamed structure is preferable in that the polishing layer has a lower ware rate than that of a polishing layer having a foam structure, and therefore has a longer life.

Next, a configuration of a polishing surface of a polishing layer of the polishing pad according to the present embodiment will be described in detail with reference to the drawings. FIGS. 1 and 1B are schematic views for illustrating a polishing pad 10 according to the present embodiment. In FIG. 1A, (a) is a schematic plan view as viewed from the side of a polishing surface P, which is one surface of a polishing layer of the polishing pad 10, and (b) is a partial enlarged schematic view of the polishing surface P shown in (a). FIG. 1B is a schematic cross-sectional view taken along the arrowed line II-II' in (b) of FIG. LA.

In FIGS. 1A and 1B, numeral 10 indicates a circular polishing pad including a polishing layer 5 having the polishing surface P as one surface. Referring to the schematic cross-sectional view of FIG. 1B, the polishing pad 10 has a layer configuration in which the polishing surface P is provided on one surface of the polishing layer 5, and a cushioning layer 7 is bonded to the other surface thereof via an adhesion layer 6.

The polishing pad according to the present embodiment may have a stacked structure of two or more layers, in which, as in the case of the polishing pad 10, a cushioning layer 7 is stacked on the side of a surface opposite to the polishing surface P, or another layer such as a support body layer is stacked on the side of a surface opposite to the polishing surface, or may have a monolayer structure composed only of a polishing layer. It is particularly preferable that, as in the case of the polishing pad 10, the polishing pad of the present embodiment has a stacked structure in which the cushioning layer 7 is stacked on the side of a surface opposite to the polishing surface of the polishing layer, from the viewpoint of more easily improving the polishing uniformity in the plane of the surface to be polished. When the polishing pad has a stacked structure, a cushioning layer or a support body layer is stacked on the side of a surface opposite to the polishing surface of the polishing layer via a pressure-sensitive adhesive or an adhesive.

The C hardness of the cushioning layer is preferably 20 to 70. The raw material of the cushioning layer is not particularly limited. Specific examples thereof include a sheet obtained by impregnating a non-woven fabric with a resin, and a sheet of an elastomer having a non-foamed structure or a foam structure. More specific examples include sheets of composites obtained by impregnating a non-woven fabric with a polyurethane; rubbers such as natural rubber, nitrile rubber, polybutadiene rubber and silicone rubber; thermoplastic elastomers such as a polyester-based thermoplastic elastomer, a polyamide-based thermoplastic elastomer and a fluorine-based thermoplastic elastomer; foamed plastics; and polyurethanes. Among these, a sheet of a polyurethane having a foam structure is particularly preferable because desirable flexibility can be easily obtained.

Referring now to (b) of FIG. 1A and FIG. 1B, the polishing surface P includes a deep-groove region G having a first pattern formed by a deep groove or hole 1 having a depth of 0.3 mm or more, and a land region L that is the region other than the deep-groove region G. On the polishing pad 10, a spiral pattern is formed as the first pattern, as shown in FIG. 1A. The land region L includes shallow recesses 2 having a second pattern and a depth of 0.01 to 0.1 mm, and a plurality of island-like land portions 3 surrounded by the shallow recess 2. Here, the island-like land portions refer to protrusions protruding from the shallow recesses, the protrusions each including a peripheral edge that is independent of and discontinuous with the land portions therearound. In the polishing pad 10, a triangular grid pattern is formed as the second pattern. Although the deep-groove region G and the shallow recesses 2 are formed on the entire polishing surface in the polishing pad 10 shown in FIGS. 1A and 1B, the deep-groove region G and the shallow recesses 2 are not necessarily formed on the entire polishing surface, and need only be formed in a region that is in contact with at least the base material to be polished.

Referring to the schematic cross-sectional view of FIG. 1B, the deep groove or hole 1 that forms the deep-groove region G is deeper than the shallow recesses 2 formed in the land region L. Specifically, the depth of the deep groove or hole is 0.3 mm or more, and the shallow recesses have a depth of 0.01 to 0.1 mm.

The deep groove or hole having a depth of 0.3 mm or more acts as a liquid reservoir for retaining a slurry and supplying the slurry to the land region during polishing. Such a deep groove or hole having a depth of 0.3 mm or more maintains a depth that allows the slurry to be sufficiently retained even after a break-in treatment for finely roughening the polishing surface of an unused polishing pad.

On the other hand, the land region, which includes the shallow recesses having a second pattern and a depth of 0.01 to 0.1 mm, and the plurality of island-like land portions surrounded by the shallow recesses, reduces the time required for break-in for finely roughening the polishing surface of an unused polishing pad, and the time required for running-in polishing. More specifically, at the time of conditioning a polishing surface using a pad conditioner, the island-like land portions increase the number of contact points between the polishing surface and the pad conditioner, thus reducing the time for roughening the polishing surface to a suitable surface roughness.

The depth of the deep groove or hole formed on the polishing surface is 0.3 mm or more, preferably 0.3 to 3.0 mm, more preferably 0.4 to 2.5 mm, particularly preferably 0.5 to 2.0 mm, and quite particularly preferably 0.6 to 1.5 mm. Note that, unless otherwise specified, the depth of the deep groove or hole is based on the depth of the deep groove or hole from the surface of the land portions on a polishing surface of an unused polishing pad before undergoing a break-in treatment.

When the depth of the deep groove or hole is less than 0.3 mm, if continuously used, the polishing pad tends to wear out such that the deep groove or hole becomes a shallow groove or hole having a depth of less than 0.1 mm, for example, after using for a short period of time. Accordingly, the life of the polishing pad is likely to be reduced, or the polishing rate is likely to vary. In order to sufficiently retain the slurry, the deep groove or hole preferably has a depth of at least 0.2 mm or more even at the end of life of the polishing pad. On the other hand, when the depth of the deep groove or hole is too deep, the volume of the deep groove or hole becomes too large, so that a large amount of slurry needs to be supplied for polishing the surface to be polished, which may be undesirable in terms of cost.

The pattern formed as the first pattern formed by the deep groove or hole having a depth of 0.3 mm or more is not particularly limited, and may be a pattern having regularity or a pattern having no regularity. As specific examples of the pattern formed as the first pattern, in addition to a spiral pattern, any pattern of a groove or hole or grooves or holes for supplying a slurry that has been conventionally formed on a polishing surface, such as a concentric pattern, a grid pattern, and a radial pattern can be used without any particular limitation. As an example, FIG. 2 shows a schematic plan view of a polishing pad 20 having a polishing surface including a deep-groove region G formed by deep grooves 11 having a concentric pattern as the first pattern. The polishing pad 20 is the same as the polishing pad 10 except that the spiral first pattern is changed to the concentric first pattern.

The deep groove or hole having a depth of 0.3 mm or more may be constituted only by a deep groove or a hole, or may be a combination of a deep groove and a hole. Examples of the shape of the hole on a polishing surface include a circular shape, an elliptical shape, an oval shape, a triangular shape, and a rectangular shape.

When the polishing pad is of the stack type in which a cushioning layer is stacked, it is preferable that a deep groove having a depth corresponding to preferably 30 to 90%, more preferably 40 to 85%, and particularly preferably 50 to 80% of the thickness of the polishing layer is formed on the polishing surface, from the viewpoint of easily achieving both the polishing uniformity and the planarization performance.

As the pattern formed as the first pattern, a spiral pattern, a concentric pattern, or a grid pattern are preferable, and a spiral pattern or a grid pattern is particularly preferable because of the excellent slurry retention and the excellent performance in supplying the slurry to the land region. When the first pattern has a spiral, concentric, or grid pattern, the groove pitch and the groove width are not particularly limited. However, the first pattern has preferably a groove pitch of 1 to 15 mm and a groove width of 0.1 to 4 mm, more preferably has a groove pitch of 2 to 12 mm and a groove width of 0.2 to 3 mm, and particularly preferably has a groove pitch of 3 to 10 mm and a groove width of 0.3 to 2 mm, from the viewpoint of providing particularly excellent polishing rate and polishing uniformity.

Referring to FIG. 1B, in the polishing pad 10, the cross-sectional shape of the deep groove or hole 1 when the deep groove or hole 1 is cut perpendicularly to the longitudinal direction is rectangular. The cross-sectional shape of the deep groove or hole is not particularly limited. Specifically, besides a rectangular shape, the cross-sectional shape may be a trapezoidal shape, a triangular shape, a semicircular shape, a semi-oval shape, or the like.

The ratio of the projected area of the deep-groove region is preferably 5 to 40%, and more preferably 10 to 30%, to the overall projected area of the polishing surface, from the viewpoint of providing excellent balance between the slurry retention and the polishing rate. Here, the projected area is the area of the polishing surface as projected to a two-dimensional plane. When the projected area of the deep-groove region to the overall projected area of the polishing surface is too low, the amount of the slurry retained during polishing is reduced, so that the polishing rate and the polishing uniformity tend to be reduced. On the other hand, when the ratio of the projected area of the deep-groove region is too high, the polishing rate tends to be reduced due to a reduction in contact area of the land region in contact with the surface to be polished that is polished during polishing, or polishing nonuniformity tends to occur due to a mark of the deep groove or the hole having been transferred to the surface to be polished.

On the other hand, the land region L includes shallow recesses 2 having a second pattern and a depth of 0.01 to 0.1 mm, and a plurality of island-like land portions 3 surrounded by the shallow recesses 2. Referring to FIG. 1A, on the polishing pad 10, the shallow recesses 2 having a triangular grid pattern as the second pattern are evenly formed on the entire surface of the land region L. Each of the plurality of island-like land portions 3 surrounded by the shallow recesses 2 having the triangular grid-like second pattern has a triangular shape, or a shape resulting from a triangular shape being divided by the deep groove or hole 1.

The pattern formed as the second pattern formed by the shallow recesses having a depth of 0.01 to 0.1 mm is not particularly limited, and may be a pattern having regularity or a pattern having no regularity. However, it is preferable that the pattern is a pattern having regularity from the viewpoint of providing excellent productivity and quality control performance. Specific examples of the pattern formed as the second pattern include a triangular grid pattern, a rectangular grid such as an XY grid pattern, a square grid pattern, and a diamond-shaped grid pattern, and a hexagonal grid. Among these, a triangular grid pattern is particularly preferable because the pad conditioner easily comes into uniform contact, from all directions, with the plurality of island-like land portions surrounded by the shallow recesses, so that the break-in time can be further reduced. In addition, a triangular grid pattern is preferable because it can be formed by a combination of linear shallow recesses, and is thus can be easily formed by cutting.

The shape of the plurality of island-like land portions surrounded by the shallow recesses is triangular when the second pattern is a triangular grid pattern, square when the second pattern is a square grid pattern, diamond-shaped when the second pattern is a diamond-shaped grid pattern, or hexagonal when the second pattern is a hexagonal grid pattern.

FIG. 3A is a partial enlarged schematic view of a polishing surface of a polishing pad 30 according to another example of the present embodiment, and FIG. 3B is a schematic cross-sectional view of the polishing pad 30. The polishing pad 30 is the same as the polishing pad 10 except that the triangular grid-like second pattern is changed to a square grid-like second pattern. FIG. 3A is a partial enlarged schematic view of the polishing pad 30 as viewed from the side of a polishing surface, which is one surface of the polishing layer, and FIG. 3B is a schematic cross-sectional view taken along the arrowed line III-III' in FIG. 3A.

Shallow recesses 12 having a second pattern that is a square grid pattern is formed on the polishing surface of the polishing pad 30, and a plurality of island-like land portions 13 surrounded by the shallow recesses 12 have a square shape, or a shape resulting from a square shape being divided by the deep groove or hole 1.

FIG. 4 shows a partial enlarged schematic view of a polishing surface of a polishing pad 40 according to another example of the present embodiment. The polishing pad 40 is the same as the polishing pad 10 except that the triangular grid-like second pattern is changed to a diamond-shaped grid-like second pattern. Shallow recesses 22 having a second pattern that is a diamond-shaped grid pattern are formed on the polishing surface of the polishing pad 40, and a plurality of island-like land portions 23 surrounded by the shallow recesses 22 have a diamond shape, or a shape resulting from a diamond shape being divided by the deep groove or hole 1.

The depth of the shallow recesses formed in the land region is 0.01 to 0.1 mm, preferably 0.02 to 0.09 mm, more preferably 0.03 to 0.08 mm, and particularly preferably 0.04 to 0.07 mm. When the depth of the shallow recesses is 0.01 to 0.1 mm, the island-like land portions wear out in a short period of time during break-in for roughening an unused polishing pad to a roughness suitable for polishing or running-in polishing, so that the time for achieving a roughness suitable for polishing can be reduced. Note that, unless otherwise specified, the depth of the shallow recesses is also based on the depth of the shallow recesses from the surface of the land portions on a polishing surface of an unused polishing pad before undergoing a break-in treatment.

When the depth of the shallow recesses formed in the land region exceeds 0.1 mm, the time required for break-in or running-in polishing tends to be increased, and the polishing characteristics tend to change over time as a result of the land portions remaining after break-in having changed the slurry retention or the contact area with the surface to be polished during polishing. When the depth of the shallow recesses is less than 0.01 mm, the time required for the break-in or running-in polishing is increased as a result of a reduction in the action of the conditioner to concentratedly come into contact with the land portions due to a small height difference between the land portions and the shallow recesses.

When the shallow recesses have a grid pattern such as a triangular grid pattern, a rectangular grid pattern, or a hexagonal grid pattern, the pitch and the width of the shallow recesses are not particularly limited. Referring to FIG. 5 for a triangular grid pattern, FIG. 6 for a rectangular grid pattern, and FIGS. 7 and 8 for a hexagonal grid pattern, the pitch ($P_1$, $P_2$, $P_3$, $P_4$) is preferably 1 to 8 mm, and more preferably 2 to 6 mm. The width ($W_1$, $W_2$, $W_3$, $W_4$) is preferably 0.5 to 4 mm, and more preferably 1 to 2 mm. Such pitch and width are preferable because land portions to which the pad conditioner can easily come into uniform contact can be easily formed.

Referring to FIGS. 5 to 8, a maximum distance in a horizontal direction ($M_1$, $M_2$, $M_3$, $M_4$) of the land portions, which is a maximum distance of one land portion, is 8 mm or less, preferably 0.5 to 6 mm, more preferably 0.7 to 5 mm, particularly preferably 1 to 4.5 mm, and quite particularly preferably 1.5 to 4 mm, because the pad conditioner can easily come into uniform contact with each of the land portions surrounded by the shallow recesses, so that the land portions quickly wear out, thus making it possible to further reduce the time required for achieving a roughness suitable for polishing.

The projected area of one island-like land portion 1 is in the range of preferably 0.3 to 10 $mm^2$, more preferably 0.5 to 9 $mm^2$, particularly preferably 1 to 7 $mm^2$, and quite particularly preferably 1.5 to 5 $mm^2$. It is preferable that the projected area of one island-like land portion is in such a range, because the pad conditioner can easily come into contact with each of the land portions surrounded by the shallow recesses, so that the break-in time can be further reduced.

When the maximum distance in a horizontal direction of the land portions, which is a maximum distance of one island-like land portion, exceeds 8 mm, or when the projected area of one land portion is too large, the pad conditioner is difficult to come into uniform contact with the vicinity of the center of the land portion, so that the wear of the land portions is likely to take longer time. When the maximum distance in a horizontal direction of the land portions, which is a maximum distance of one island-like land portion, is too small, or when the projected area of one land portion is too small, the formation of the shallow recesses tends to be troublesome.

The ratio of the total projected area of the land portions to the overall projected area of the land region is preferably 10 to 50%, more preferably 15 to 45%, and particularly preferably 20 to 40%. Here, the ratio of the total projected area of the land portions means the ratio of the total of the projected areas of the land portions to the overall projected area when the land region is two-dimensionally projected without taking irregularities of the polishing surface into account. It is preferable that the ratio of the total projected area of the land portions is in such a range, because the conditioner can easily come into contact with each of the land portions surrounded by the shallow recesses, so that the time for achieving a roughness suitable for polishing can be further reduced.

Note that when the shallow recesses are in the form of a triangular grid surrounding equilateral triangular shapes as shown in FIG. 5, a maximum distance $M_1$ in a horizontal direction of one island-like land portion, a projected area $S_1$ of one island-like land portion, and a ratio $R_1$ of the total projected area of the land portions can be calculated from the following expressions.

Maximum horizontal distance of land portion [Math. 1]

$$M_1 = \sqrt{\frac{4}{3}\frac{(P_1 - W_1)^3}{P_1}}$$

Projected area of one island-like land portion $$S_1 = \frac{(P_1 - W_1)^3}{\sqrt{3} \times P_1}$$

Ratio of total projected area of land portions (%)

$$R_1 = ((P_1 - W_1)/P_1)^3 \times 100$$

When the shallow recesses have a square grid pattern as shown in FIG. 6, a maximum distance $M_2$ in a horizontal direction of one island-like land portion, a projected area $S_2$ of one island-like land portion, and a ratio $R_2$ of the total projected area of the land portions can be calculated from the following expressions.

Maximum horizontal distance of land portion [Math. 2]

$$M_2 = (P_2 - W_2) \times \sqrt{2}$$

Projected area of one island-like land portion $$S_2 = (P_2 - W_2)^2$$

Ratio of total projected area of land portions (%)

$$R_2 = ((P_2 - W_2)/P_2)^2 \times 100$$

When the land portions have circular shapes arranged in a regular hexagonal grid pattern as shown in FIG. 7, a maximum distance $M_3$ in a horizontal direction of one island-like land portion, a projected area $S_3$ of one island-like land portion, and a ratio $R_3$ of a total projected area of the land portions can be calculated from the following expressions.

Maximum horizontal distance of land portion [Math. 3]

$$M_3 = P_3 - W_3$$

Projected area of one island-like land portion $$S_3 = (\pi/4) \times (P_3 - W_3)^2$$

Ratio of total projected area of land portions (%)

$$R_3 = (\pi/2\sqrt{3}) \times ((P_3 - W_3)/P_3)^2 \times 100$$

When the land portions are regular hexagons arranged in a regular hexagonal grid as shown in FIG. 8, the maximum distance in a horizontal direction $M_4$ of one island-like land portion, the projected area $S_4$ of one island-like land portion, and the ratio $R_4$ of the total projected area of the land portions can be calculated from the following expressions.

Maximum horizontal distance of land portion [Math. 4]

$$M_4 = (2/\sqrt{3}) \times (P_4 - W_4)$$

Projected area of one island-like land portion $$S_4 = (\sqrt{3}/2) \times (P_4 - W_4)^2$$

Ratio of total projected area of land portions (%)

$$R_4 = ((P_4 - W_4)/P_4)^2 \times 100$$

Referring to FIG. 1B, in the polishing pad 10, the cross-sectional shape of the shallow recesses when the shallow recesses are cut perpendicularly to the longitudinal direction is rectangular. The cross-sectional shape of the shallow recesses of the polishing pad is not particularly limited. Specifically, besides a rectangular shape, the cross-sectional shape may be a trapezoidal shape, a triangular shape, a semi-circular shape, a semi-oval shape, a sine curve, or the like.

The method for forming the deep-groove region and the land region of the polishing surface of the polishing layer of the polishing pad according to the present embodiment are not particularly limited. The deep-groove region and the land region may be formed individually in separate steps, or may be formed simultaneously in one step. In the case of forming the deep-groove region and the land region in separate steps, either of the deep-groove region or the land region may be formed first.

The method for forming the deep-groove region, which is an opening having a first pattern formed by a deep groove or hole of 0.3 mm or more, is not particularly limited. Specific examples thereof include a method in which a deep groove or hole is formed by cutting one surface of a polishing layer sheet; a method in which a deep groove or hole is formed by melting or volatilizing a polymer by transferring by which a heated mold or metal wire is brought into contact by stamping with one surface of a polishing layer sheet; a method in which a deep groove or hole is formed by decomposing or volatilizing a polymer by laser-processing a surface of a polishing layer sheet; and a method in which a polishing layer sheet that includes a polishing surface having a deep groove or hole is molded using a mold on which a protrusion for forming a deep groove or hole has been formed in advance.

The method for forming the land region that includes the shallow recesses having a depth of 0.01 to 0.1 mm and the second pattern, and the plurality of island-like land portions surrounded by the shallow recesses, the shallow recesses and the land portions being formed on the polishing surface of the polishing layer, is also not particularly limited. Specific examples thereof include a method in which shallow recesses are formed by cutting one surface of a polishing layer sheet along the shape of a predetermined second pattern; a method in which shallow recesses are formed by melting or volatilizing a polymer by transferring by which a heated mold or metal wire is brought into contact by stamping with one surface of a circular polymer sheet that is to form a polishing layer; a method in which shallow recesses are formed by melting or volatilizing a polymer by laser-processing one surface of a circular polymer sheet that is to form a polishing layer; and a method in which protrusions for forming shallow recesses are formed in advance on a mold used for molding a circular polymer sheet that is to form a polishing layer, and shallow recesses are formed when molding the polymer sheet. Among these, a method in which shallow recesses are formed by cutting, or a method in which shallow recesses are formed by transferring is preferable because of the excellent productivity, and the method using cutting is particularly preferable because of the high accuracy of processing shallow recesses.

Note that examples of the method for forming shallow recesses by cutting include a method in which linear shallow recesses having a depth of 0.01 to 0.1 mm are cut in one surface of a polymer sheet using a cutter such as a cutting tool blade, wherein shallow recesses having a depth of 0.01 to 0.1 mm and a second pattern are formed by combining a plurality of linear shallow recesses.

Examples of the method for forming shallow recesses by transferring include the following methods. (1) A method in which a polishing layer sheet is formed by injection molding a polymer material for forming a polishing layer, using a mold having, on a cavity surface thereof, a shape resulting from reversing the shape of shallow recesses having a second pattern, (2) a method in which a polymer sheet including shallow recesses having a second pattern is molded by forming a polymer material for forming a polishing layer into a sheet through melt extrusion using an extruder equipped with a T-die, and thereafter pressing the sheet against a cooling roll having, on a surface thereof, a shape formed by protrusions resulting from reversing the shape of shallow recesses having a second pattern, (3) a method in which shallow recesses having a second pattern are formed by melting or volatilizing a polymer by bringing, into contact with one surface of a previously produced polishing layer sheet, a heated mold having, on a surface thereof, a shape formed by protrusions having a shape resulting from reversing the shape of shallow recesses having a second pattern, and (4) a method in which a polymer sheet having a polishing surface including a land region formed by shallow recesses and a plurality of land portions is produced in a single step, by injecting an uncured resin into a mold having, on a cavity surface thereof, a shape resulting from reversing the shape of shallow recesses having a second pattern, and curing the resin, using reaction injection molding (RIM).

The polishing pad according to the present embodiment described above is preferably used for CMP. Next, an embodiment of CMP for which the polishing pad 10 of the present embodiment is used will be described.

In CMP, a CMP apparatus 100 including a circular rotary platen 101, a slurry supply nozzle 102, a carrier 103, and a pad conditioner 104 as shown in FIG. 9 is used, for example. The polishing pad 10 is attached to the surface of the rotary platen 101 by means of a double-sided pressure-sensitive adhesive sheet or the like. In addition, the carrier 103 supports a base material 50 to be polished.

In the CMP apparatus 100, the rotary platen 101 is rotated by a motor, which is not shown, in the direction indicated by the arrow, for example. The carrier 103 is rotated by a motor, which is not shown, in the direction indicated by the arrow, for example, while bringing a surface to be polished of the base material 50 to be polished into pressure contact with the polishing surface of the polishing pad 10. The pad conditioner 104 is rotated in the direction indicated by the arrow, for example. When the diameter of the pad conditioner 104 is smaller than the diameter of the base material 50 to be polished, the pad conditioner 104 is oscillated in the radial direction of the rotary platen 101 in order to roughen, to a roughness suitable for polishing, the entire region of the polishing pad that comes into contact with the material to be polished.

When an unused polishing pad is used, conditioning called break-in for forming a roughness suitable for polishing by finely roughening the polishing surface of the polishing pad is usually performed prior to polishing the base material to be polished. Specifically, while pouring water onto the surface of the polishing pad 10 that is fixed to the rotary platen 101 and is rotated, the pad conditioner 104 for CMP is pressed against the surface of the polishing pad 10 so as to condition the surface. As the pad conditioner, it is possible to use, for example, a pad conditioner in which diamond particles are fixed onto the surface of a carrier by electrodeposition of nickel or the like.

For a polishing pad including a high-hardness polishing layer, there has been a problem in that time is required for break-in, which is conditioning for forming, on the polishing surface of an unused polishing pad, a roughness suitable for polishing. Also, in polishing after break-in, time may also be required for running-in polishing performed until the polishing characteristics are stabilized. With the polishing pad according to the present embodiment, the polishing surface of an unused polishing pad is provided with a land region including shallow recesses having a depth of 0.01 to 0.1 mm and a second pattern, and a plurality of island-like land portions surrounded by the shallow recesses. Accordingly, the pad conditioner easily comes into uniform contact, from all directions, with the plurality of island-like land portions surrounded by the shallow recesses, so that the break-in time is reduced. FIGS. 10A and 10B are explanatory diagrams for illustrating changes of a polishing surface of the polishing pad 10 of the present embodiment during break-in. FIG. 10A shows a portion of the polishing surface before being subjected to conditioning, and FIG. 10B shows the portion of the polishing surface after being subjected to conditioning. In the state before conditioning, shown in FIG. 10A, the polishing surface P includes a deep-groove region G that has a first pattern and that is formed by a deep groove or hole 1 having a depth of 0.3 mm or more, and a land region L that is the region other than the deep-groove region G. Then, by performing conditioning, a plurality of island-like land portions 3 surrounded by the shallow recesses 2 of the land region L gradually wear out, and the shallow recesses 2 become shallower. Then, by continuously performing conditioning, the island-like land portions 3 wear out and the height thereof becomes lower. Similarly, the shallow recesses 2 also become shallower, as shown in FIG. 10B. With the polishing pad according to the present embodiment, the area that requires conditioning can be reduced on a polishing surface of an unused polishing pad, and the pad conditioner is more easily caught on peripheral edges of the island-like land portions, thus increasing the frictional force. Accordingly, the break-in time is reduced.

Although not by way of particular limitation, when the average depth of the shallow recesses has become less than 0.01 mm, the action of the shallow recesses is substantially reduced, whereby the polishing characteristics are stabilized. Although the conditions for such conditioning are not particularly limited, it is preferable to select the type, the conditioning load, and the rotational speed of the pad conditioner such that the accumulated conditioning time until the average depth of the shallow recesses becomes less than 0.01 mm is preferably 30 minutes or less, more preferably 1 to 20 minutes, and particularly preferably 2 to 15 minutes, because the start-up treatment of the polishing pad is finished in a short period of time, and the polishing characteristics are stabilized. Note that only during the start-up treatment of the polishing pad, the conditioning load and the rotational speed may be increased to promote the wear of the island-like land portions.

As for the type of the pad conditioner, pad conditioners with a diamond grit of #60 to 200 are preferable, the pad conditioner may be selected as appropriate according to the resin composition of the polishing layer and the polishing conditions. The conditioning load is dependent on the diameter of the conditioner, and is preferably 5 to 50 N when the diameter is 150 mm or less, 10 to 250 N when the diameter is 150 to 250 mm, and 50 to 300 N when the diameter is 250 mm or more. The rotational speed of each of the conditioner and the platen is preferably 10 to 200 rpm. However, in order to prevent synchronization of rotation, it is preferable that the numbers of rotation of the conditioner and the platen are different.

Then, after completion of break-in, the polishing of the surface to be polished of the base material to be polished is started. In polishing, the slurry is supplied from the slurry supply nozzle to the surface of the rotating polishing pad. The slurry contains, for example, a liquid medium such as water or oil; an abrasive such as silica, alumina, cerium oxide, zirconium oxide, or silicon carbide; a base; an acid; a surfactant; an oxidizing agent; a reducing agent; and a chelating agent. In performing CMP, a lubricating oil, a coolant, and the like may be used as needed in combination with the slurry. Then, the base material to be polished that is fixed to the carrier and is rotated is pressed against the polishing pad on which the slurry is evenly spread on the polishing surface. Then, the polishing treatment is continued until a predetermined flatness or polishing amount is achieved. Adjustment of the pressing force applied during polishing or the speed of relative movement between the rotary platen and the carrier affects the finishing quality.

Although the polishing conditions are not particularly limited, the rotational speed of each of the platen and the base material to be polished is preferably as low as 300 rpm or less, in order to efficiently perform polishing. The pressure applied to the base material to be polished in order to press the base material against the polishing pad is preferably 150 kPa or less, from the viewpoint of preventing generation of scratches after polishing. During polishing, it is preferable that the slurry is continuously or discontinuously supplied to the polishing pad such that the slurry is evenly spread onto the polishing surface.

Then, after the base material to be polished that has undergone polishing is fully washed, the base material is dried by removing water droplets attached thereto by using a spin drier or the like. In this manner, the surface to be polished becomes a smooth surface.

Such CMP according to the present embodiment is preferably used for polishing performed during the manufacturing process of various semiconductor devices, micro electro mechanical systems (MEMS), and the like. Examples of the object to be polished include semiconductor substrates such as silicon, silicon carbide, gallium nitride, gallium arsenic, zinc oxide, sapphire, germanium, and diamond; wiring materials, including, for example, an insulating film such as a silicon oxide film, a silicon nitride film, or a low-k film formed on a wiring board having predetermined wiring, and copper, aluminum, and tungsten; glass, crystal, an optical substrate, and a hard disk. In particular, the polishing pad according to the present embodiment is preferably used for polishing insulating films and wiring materials formed on semiconductor substrates.

EXAMPLES

Hereinafter, the present invention will be described in further detail by way of examples. It should be appreciated that the scope of the invention is by no means limited to the examples.

Production Example 1

Polytetramethylene glycol [abbreviation: PTMG] having a number-average molecular weight of 850, polyethylene glycol [abbreviation: PEG] having a number-average molecular weight of 600, 1,4-butanediol [abbreviation: BD], and 4,4'-diphenylmethane diisocyanate [abbreviation: MDI] were blended at mass ratio of PTMG:PEG:BD:MDI of 24.6:11.6:13.8:50.0, and the resulting blend was continuously supplied to a coaxially rotating twin-screw extruder using a metering pump, and was subjected to continuous melt-polymerization, to give a thermoplastic polyurethane. Then, the polymerized thermoplastic polyurethane melt was continuously extruded in the form of a strand into water, and was subsequently finely cut into pellets using a pelletizer. The pellets were dried through dehumidification for 20 hours at 70° C., were subsequently supplied to a single-screw extruder, and were extruded from a T-die, to mold a sheet having a thickness of 2.0 mm. Then, after the surface of the obtained sheet was ground to give a sheet having a uniform thickness of 1.5 mm, the sheet was cut into a circular shape having a diameter of 38 cm, to give a polishing layer sheet. The D hardness of the polishing layer sheet, as measured at a measurement temperature of 25° C. in accordance with JIS K 7311, was 67.

Production Example 2

PTMG, PEG, BD, and MDI were blended at a mass ratio of PTMG:PEG:BD:MDI of 19.5:9.2:16.4:54.9, and the resulting blend was continuously supplied into a coaxially rotating twin-screw extruder using a metering pump, and was subjected to continuous melt-polymerization, to give a thermoplastic polyurethane. Then, the polymerized thermoplastic polyurethane melt was continuously extruded in the form of a strand into water, and was subsequently finely cut into pellets using a pelletizer. The pellets were dried through dehumidification for 20 hours at 70° C., were subsequently supplied to a single-screw extrusion molder, and were extruded from a T-die, to mold a sheet having a thickness of 2.0 mm. Then, after the surface of the obtained sheet was ground to give a sheet having a uniform thickness of 1.5 mm, the sheet was cut into a circular shape having a diameter of 38 cm, to give a polishing layer sheet. The D hardness of the polishing layer sheet, as measured at a measurement temperature of 25° C. in accordance with JIS K 7311, was 76.

Example 1

A spiral deep groove having a width of 0.7 mm, a depth of 1.0 mm, and a groove pitch of 9.0 mm was formed by cutting on a polishing surface, which is one surface of the polishing layer sheet having a thickness of 1.5 mm and a diameter of 38 cm, obtained in Production Example 1. Note that the cross-sectional shape of the deep groove was rectangular. At this time, the ratio of the area of the deep-groove region to the total area of the polishing surface was 8%.

Then, shallow recesses in the form of a triangular grid formed by a plurality of straight lines having a width of 1.0 mm, a depth of 0.08 mm, and a pitch of 4.0 mm were formed by cutting on the polishing surface with the deep groove formed thereon. The cross-sectional shape of the shallow recesses is also rectangular. In this manner, a large number of island-like, equilateral triangular land portions each having a length of one side of 3.0 mm that were surrounded by a large number of shallow recesses were formed. The projected area of one island-like land portion was 3.9 mm$^2$, and the maximum distance in the horizontal direction of one island-like land portion was 3.0 mm. The ratio of the total projected area of the land portions to the overall projected area of the land region was 42%. An enlarged photograph of the polishing surface of the obtained polishing pad is shown in FIG. 11. As a result of measuring the surface roughness of the land region in accordance with JIS B 0601:2001 and JIS B 0671:2002, using a surface roughness tester ("SURFTEST SJ-210" manufactured by Mitutoyo Corporation), the arithmetic mean roughness Ra was 9.8 μm, the maximum height Rz was 55.0 μm, and the reduced peak height Rpk was 13.2 μm.

The depths of the shallow recesses and the deep groove were measured at eight points at portions in contact with a wafer, using a depth gauge "E-DP2J" manufactured by Nakamura Mfg. Co., Ltd. The projected area of one island-like land portion and the maximum distance in the horizontal direction of one island-like land portion were obtained by measuring $P_1$ and $W_1$ in FIG. 5 using a scale loupe "No. 1983" manufactured by Tohkai Sangyo Co., Ltd, and using the expressions in Math. 1.

Then, a cushioning layer was attached to the back surface of the polishing layer as opposed to the polishing surface with a double-sided pressure-sensitive adhesive sheet, to form a multilayer polishing pad. As the cushioning layer, a "Poron H48" manufactured by INOAC Corporation, a foamed polyurethane sheet having a thickness of 0.8 mm, was used. Then, the polishing characteristics of the obtained polishing pad were evaluated by the following evaluation methods.

<Polishing Rate and Conditioning Time until Shallow Recesses Disappear>

The obtained polishing pad was mounted to a polishing device "MAT-BC15" manufactured by MAT in Kemet Japan Co., Ltd. Then, a polishing slurry having a pH of about 12 obtained by diluting two-fold a polishing slurry "SS-25" manufactured by Cabot Microelectronics Corp. was prepared, and a 4-inch-diameter silicon wafer having a silicon oxide film with a thickness of 1000 nm on the surface thereof was polished for 60 seconds at a platen rotation rate of 100 rpm, a head rotation rate of 99 rpm, and a polishing pressure of 41.4 kPa, while supplying the slurry onto the polishing surface of the polishing pad at a rate of 120 mL/min.

Then, using a pad conditioner (a diamond dresser (diamond grit #100 blocky, metal base diameter: 19 cm) manufactured by A.L.M.T. Corp.), the surface of the polishing pad was conditioned for 30 seconds at a dresser rotation rate of 70 rpm, a polishing pad rotation rate of 100 rpm, and a dresser load of 20 N, while pouring pure water at a rate of 150 mL/min. Then, another silicon wafer was polished with the polishing pad, and the polishing pad was further conditioned for 30 seconds. In this manner, 100 silicon wafers were polished. Then, the thicknesses before and after polishing of the 3rd, 5th, 10th, 15th, 25th, 50th, and 100th polished silicon wafers were measured, and the polishing rates were determined. In addition, the depth of the shallow recesses was measured each time two silicon wafers were polished, and the accumulated conditioning time was determined when the depth had become less than 0.01 mm.

The results are shown in Table 1. An enlarged photograph of the polishing surface after polishing ten silicon wafers with the polishing pad of Example 1 is shown in FIG. 12. It can be seen that the polishing surface has good affinity with water, and the polishing surface has been finely roughened with the conditioner and has excellent slurry retention.

TABLE 1

| | Example No. | Ex. 1 | Ex. 2 | Ex. 3 | Ex. 4 | Ex. 5 | Ex. 6 |
|---|---|---|---|---|---|---|---|
| | Polishing layer sheet | Prod. Ex. 1 | Prod. Ex. 1 | Prod. Ex. 1 | Prod. Ex. 1 | Prod. Ex. 1 | Prod. Ex. 1 |
| Deep-groove region | Depth (mm) | 1.0 | 1.0 | 1.0 | 1.0 | 1.0 | 1.0 |
| | Upper surface width (mm) | 0.7 | 0.7 | 0.7 | 0.7 | 0.3 | 0.7 |
| | Groove pitch (mm) | 9.0 | 4.5 | 4.5 | 4.5 | 2.5 | 4.5 |
| | First pattern | Spiral | Spiral | Spiral | Spiral | Concentric | Spiral |
| | Ratio of total projected area of deep-groove region (%) | 8 | 16 | 16 | 16 | 12 | 16 |
| Land region | Depth of shallow recesses (mm) | 0.08 | 0.04 | 0.06 | 0.03 | 0.05 | 0.05 |
| | Upper surface width of shallow recesses (mm) | 1.0 | 1.0 | 1.5 | 1.0 | 2.0 | 2.0 |
| | Pitch of shallow recesses (mm) | 4.0 | 3.0 | 5.5 | 2.5 | 4.5 | 9.0 |
| | Second pattern | Triangular grid | Triangular grid | Triangular grid | XY grid | Triangular grid | Triangular grid |
| | Shape of land portions | Equilateral triangle of side 3.0 mm | Equilateral triangle of side 1.9 mm | Equilateral triangle of side 3.9 mm | Square of side 1.5 mm | Equilateral triangle of side 2.2 mm | Equilateral triangle of side 7.1 mm |
| | Maximum distance of land portion (mm) | 3.0 | 1.9 | 3.9 | 2.1 | 2.2 | 7.1 |
| | Projected area of land portion (mm$^2$) | 3.9 | 1.5 | 6.7 | 2.3 | 2.0 | 22.0 |
| | Ratio of total projected area of land portions (%) | 42 | 30 | 38 | 36 | 17 | 47 |

TABLE 1-continued

| | | | | | | | |
|---|---|---|---|---|---|---|---|
| Polishing rate (nm/min) | 3rd | 145 | 149 | 120 | 139 | 161 | 76 |
| | 5th | 154 | 172 | 151 | 163 | 185 | 94 |
| | 10th | 165 | 186 | 170 | 183 | 193 | 105 |
| | 15th | 179 | 200 | 191 | 199 | 208 | 136 |
| | 25th | 183 | 208 | 198 | 205 | 226 | 168 |
| | 50th | 192 | 211 | 205 | 212 | 233 | 192 |
| | 100th | 198 | 213 | 210 | 216 | 236 | 202 |
| Accumulated conditioning time until shallow recesses become less than 0.01 mm (min) | | 19 | 9 | 22 | 14 | 13 | 34 |

| | | Example No. | Ex. 7 | Ex. 8 | Ex. 9 | Ex. 10 | Ex. 11 |
|---|---|---|---|---|---|---|---|
| | | Polishing layer sheet | Prod. Ex. 1 | Prod. Ex. 2 | Prod. Ex. 2 | Prod. Ex. 2 | Prod. Ex. 2 |
| Deep-groove region | Depth (mm) | | 1.0 | 0.8 | 0.8 | 0.8 | 0.8 |
| | Upper surface width (mm) | | 0.7 | 1.5 | 1.5 | 1.5 | 2.0 |
| | Groove pitch (mm) | | 4.5 | 7.0 | 7.0 | 7.0 | 7.0 |
| | First pattern | | Spiral | Spiral | Spiral | Spiral | Spiral |
| | Ratio of total projected area of deep-groove region (%) | | 16 | 21 | 21 | 21 | 29 |
| Land region | Depth of shallow recesses (mm) | | 0.05 | 0.05 | 0.03 | 0.05 | 0.07 |
| | Upper surface width of shallow recesses (mm) | | 2.0 | 1.0 | 1.5 | 1.0 | 1.0 |
| | Pitch of shallow recesses (mm) | | 7.0 | 2.5 | 6.0 | 3.0 | 2.5 |
| | Second pattern | | XY grid | Triangular grid | Triangular grid | XY grid | Hexagonal grid |
| | Shape of land portions | | Square of side 5.0 mm | Equilateral triangle of side 1.3 mm | Equilateral triangle of side 4.5 mm | Square of side 2.0 mm | Circle with diameter of 1.5 mm |
| | Maximum distance of land portion (mm) | | 7.1 | 1.3 | 4.5 | 2.8 | 1.5 |
| | Projected area of land portion (mm$^2$) | | 25.0 | 0.8 | 8.8 | 4.0 | 1.8 |
| | Ratio of total projected area of land portions (%) | | 51 | 22 | 42 | 44 | 33 |
| Polishing rate (nm/min) | 3rd | | 91 | 141 | 120 | 142 | 140 |
| | 5th | | 101 | 171 | 149 | 165 | 156 |
| | 10th | | 116 | 189 | 173 | 185 | 180 |
| | 15th | | 137 | 196 | 182 | 192 | 188 |
| | 25th | | 155 | 207 | 198 | 204 | 200 |
| | 50th | | 176 | 220 | 215 | 223 | 202 |
| | 100th | | 193 | 225 | 220 | 226 | 212 |
| Accumulated conditioning time until shallow recesses become less than 0.01 mm (min) | | | 39 | 8 | 17 | 19 | 23 |

Example 2

A spiral deep groove having a width of 0.7 mm, a depth of 1.0 mm, and a groove pitch of 4.5 mm was formed by cutting on a polishing surface, which is one surface of the polishing layer sheet having a thickness of 1.5 mm and a diameter of 38 cm, obtained in Production Example 1. Note that the cross-sectional shape of the deep groove was rectangular. At this time, the ratio of the area of the deep groove to the overall area of the polishing surface was 16%.

Then, shallow recesses in the form of a triangular grid formed by a plurality of straight lines having a width of 1.0 mm, a depth of 0.04 mm, and a pitch of 3.0 mm were further formed by cutting on the entire polishing surface with the deep groove formed thereon. The cross-sectional shape of the shallow recesses is also rectangular. In this manner, a large number of island-like, equilateral triangular land portions each having a length of one side of 1.9 mm that were surrounded by a large number of shallow recesses were formed. The projected area of one island-like land portion was 1.5 mm$^2$, the maximum distance in the horizontal direction of one island-like land portion was 1.9 mm, and the ratio of the total projected area of the land portions to the overall projected area of the land region was 30%. In this manner, a polishing layer was produced.

Then, using the obtained polishing layer, a polishing pad was formed and evaluated in the same manner as in Example 1. The results are shown in Table 1.

Example 3

A polishing layer was produced in the same manner as in Example 2 except that shallow recesses in the form of a triangular grid formed by a plurality of straight lines having a width of 1.5 mm, a depth of 0.06 mm, and a pitch of 5.5 mm were formed on the polishing surface, instead of forming shallow recesses in the form of a triangular grid formed by a plurality of straight lines having a width of 1.0 mm, a depth of 0.04 mm, and a pitch of 3.0 mm. The cross-sectional shape of the shallow recesses was rectangular. A large number of island-like, equilateral triangular land portions each having a length of one side of 3.9 mm that were surrounded by a large number of shallow recesses were formed on the polishing surface. The projected area of one island-like land portion was 6.7 mm$^2$, the maximum distance in the horizontal direction of one island-like land portion was 3.9 mm, and the ratio of the total projected area of the land portions to the overall projected area of the land region was 38%. In this manner, a polishing layer was produced.

Then, using the obtained polishing layer, a polishing pad was formed and evaluated in the same manner as in Example 1. The results are shown in Table 1.

Example 4

A polishing layer was produced in the same manner as in Example 2 except that shallow recesses in the form of an XY grid formed by a plurality of straight lines having a width of 1.0 mm, a depth of 0.03 mm, and a pitch of 2.5 mm were formed on the polishing surface, instead of forming shallow recesses in the form of a triangular grid formed by a plurality of straight lines having a width of 1.0 mm, a depth of 0.04 mm, and a pitch of 3.0 mm. The cross-sectional shape of the shallow recesses was rectangular. A large number of island-like, square land portions each having a length of one side of 1.5 mm that were surrounded by a large number of shallow recesses were formed on the polishing surface. The projected area of one island-like land portion was 2.3 mm$^2$, the maximum distance in the horizontal direction of one island-like land portion was 2.1 mm, and the ratio of the total projected area of the land portions to the overall projected area of the land region was 36%. In this manner, a polishing layer was produced.

Then, using the obtained polishing layer, a polishing pad was formed and evaluated in the same manner as in Example 1. The results are shown in Table 1.

Example 5

A plurality of concentric deep grooves having a width of 0.3 mm, a depth of 1.0 mm, and a groove pitch of 2.5 mm were formed by cutting on a polishing surface, which is one surface of the polishing layer sheet having a thickness of 1.5 mm and a diameter of 38 cm, obtained in Production Example 1. Note that the cross-sectional shape of the deep grooves was rectangular. At this time, the ratio of the area of the deep grooves to the total area of the polishing surface was 12%.

Then, shallow recesses in the form of a triangular grid formed by a plurality of straight lines having a width of 2.0 mm, a depth of 0.05 mm, and a pitch of 4.5 mm were further formed by cutting on the entire polishing surface with the deep grooves formed thereon. The cross-sectional shape of the shallow recesses is also rectangular. In this manner, a large number of island-like, equilateral triangular land portions each having a length of one side of 2.2 mm that were surrounded by a large number of shallow recesses were formed. The projected area of one island-like land portion was 2.0 mm$^2$, the maximum distance in the horizontal direction of one island-like land portion was 2.2 mm, and the ratio of the total projected area of the land portions to the overall projected area of the land region was 17%. In this manner, a polishing layer was produced.

Then, using the obtained polishing layer, a polishing pad was formed and evaluated in the same manner as in Example 1. The results are shown in Table 1.

Example 6

A polishing layer was produced in the same manner as in Example 2 except that shallow recesses in the form of a triangular grid formed by a plurality of straight lines having a width of 2.0 mm, a depth of 0.05 mm, and a pitch of 9.0 mm were formed on the polishing surface, instead of forming shallow recesses in the form of a triangular grid formed by a plurality of straight lines having a width of 1.0 mm, a depth of 0.04 mm, and a pitch of 3.0 mm. The cross-sectional shape of the shallow recesses was rectangular. A large number of island-like, equilateral triangular land portions each having a length of one side of 7.1 mm that were surrounded by a large number of shallow recesses were formed on the polishing surface. The projected area of one island-like land portion was 22.0 mm$^2$, the maximum distance in the horizontal direction of one island-like land portion was 7.1 mm, and the ratio of the total projected area of the land portions to the overall projected area of the land region was 47%. In this manner, a polishing layer was produced.

Then, using the obtained polishing layer, a polishing pad was formed and evaluated in the same manner as in Example 1. The results are shown in Table 1.

Example 7

A polishing layer was produced in the same manner as in Example 2 except that shallow recesses in the form of an XY grid formed by a plurality of straight lines having a width of 2.0 mm, a depth of 0.05 mm, and a pitch of 7.0 mm were formed on the polishing surface, instead of forming shallow recesses in the form of a triangular grid formed by a plurality of straight lines having a width of 1.0 mm, a depth of 0.04 mm, and a pitch of 3.0 mm. The cross-sectional shape of the shallow recesses was rectangular. A large number of island-like, square land portions each having a length of one side of 5.0 mm that were surrounded by a large number of shallow recesses were formed on the polishing surface. The projected area of one island-like land portion was 25.0 mm$^2$, the maximum distance in the horizontal direction of one island-like land portion was 7.1 mm, and the ratio of the total projected area of the land portions to the overall projected area of the land region was 51%. In this manner, a polishing layer was produced.

Then, using the obtained polishing layer, a polishing pad was formed and evaluated in the same manner as in Example 1. The results are shown in Table 1.

Example 8

A spiral deep groove having an upper surface width of 1.5 mm, a bottom surface width of 0.5 mm, a depth of 0.8 mm, and a groove pitch of 7.0 mm was formed by cutting on a polishing surface, which is one surface of the polishing layer sheet having a thickness of 1.5 mm and a diameter of 38 cm, obtained in Production Example 2. Note that the cross-sectional shape of the deep groove was trapezoidal. At this time, the ratio of the area of the deep groove region to the total area of the polishing surface was 21%.

Then, shallow recesses in the form of a triangular grid formed by a plurality of straight lines having an upper surface width of 1.0 mm, a bottom surface width of 0.9 mm, a depth of 0.05 mm, and a pitch of 2.5 mm were further formed by cutting on the entire polishing surface with the deep groove formed thereon. The cross-sectional shape of the shallow recesses was trapezoidal. In this manner, a large number of island-like, equilateral triangular land portions each having a length of one side of 1.3 mm that were surrounded by a large number of shallow recesses were formed. The projected area of one island-like land portion was 0.8 mm$^2$, the maximum distance in the horizontal direction of one island-like land portion was 1.3 mm, and the ratio of the total projected area of the land portions to the overall projected area of the land region was 22%. In this manner, a polishing layer was produced.

Then, using the obtained polishing layer, a polishing pad was formed and evaluated in the same manner as in Example 1. The results are shown in Table 1.

Example 9

A polishing layer was produced in the same manner as in Example 8 except that shallow recesses in the form of a triangular grid formed by a plurality of straight lines having a width of 1.5 mm, a depth of 0.03 mm, and a pitch of 6.0 mm were formed on the polishing surface, instead of forming shallow recesses in the form of a triangular grid formed by a plurality of straight lines having an upper surface width of 1.0 mm, a bottom surface width of 0.9 mm, a depth of 0.05 mm, and a pitch of 2.5 mm. The cross-sectional shape of the shallow recesses was rectangular. A large number of island-like, equilateral triangular land portions each having a length of one side of 4.5 mm that were surrounded by a large number of shallow recesses were formed on the polishing surface. The projected area of one island-like land portion was 8.8 mm$^2$, the maximum distance in the horizontal direction of one island-like land portion was 4.5 mm, and the ratio of the total projected area of the land portions to the overall projected area of the land region was 42%. In this manner, a polishing layer was produced.

Then, using the obtained polishing layer, a polishing pad was formed and evaluated in the same manner as in Example 1. The results are shown in Table 1.

Example 10

A polishing layer was produced in the same manner as in Example 8 except that shallow recesses in the form of an XY grid formed by a plurality of straight lines having an upper surface width of 1.0 mm, a bottom surface width of 0.9 mm, a depth of 0.05 mm, and a pitch of 3.0 mm were formed on the polishing surface, instead of forming shallow recesses in the form of a triangular grid formed by a plurality of straight lines having an upper surface width of 1.0 mm, a bottom surface width of 0.9 mm, a depth of 0.05 mm, and a pitch of 2.5 mm. The cross-sectional shape of the shallow recesses was trapezoidal. A large number of island-like, square land portions each having a length of one side of 2.0 mm that were surrounded by a large number of shallow recesses were formed on the polishing surface. The projected area of one island-like land portion was 4.0 mm$^2$, the maximum distance in the horizontal direction of one island-like land portion was 2.8 mm, and the ratio of the total projected area of the land portions to the overall projected area of the land region was 44%. In this manner, a polishing layer was produced.

Then, using the obtained polishing layer, a polishing pad was formed and evaluated in the same manner as in Example 1. The results are shown in Table 1.

Example 11

Shallow recesses were formed on the entire polishing surface, which is one surface of the polishing layer sheet having a thickness of 1.5 mm and a diameter of 38 cm, obtained in Production Example 2, by pressing an SUS punched plate (hole shape: circle having a diameter of 1.5 mm, hole arrangement: hexagonal grid, hole pitch: 2.5 mm, aperture ratio: 33%) against the polishing surface at 150° C. by hot pressing. A larger number of island-like, circular land portions having a diameter 1.5 mm that were surrounded by the shallow recesses were formed. The projected area of one island-like land portion was 1.8 mm$^2$, the maximum distance in the horizontal direction of one island-like land portion was 1.5 mm, and the ratio of the total projected area of the land portions to the overall projected area of the land region was 33%.

Then, a spiral deep groove having an upper surface width of 2.0 mm, a bottom surface width of 1.0 mm, a depth of 0.8 mm, and a groove pitch of 7.0 mm was formed by cutting on the polishing surface. Note that the cross-sectional shape of the deep groove was trapezoidal. At this time, the ratio of the area of the deep groove region to the total area of the polishing surface was 29%. In this manner, a polishing layer was produced.

Then, using the obtained polishing layer, a polishing pad was formed and evaluated in the same manner as in Example 1. The results are shown in Table 1.

Comparative Example 1

A polishing layer was produced in the same manner as in Example 1 except that the shallow recesses were not formed in Example 1. Then, using the obtained polishing layer, a polishing pad was formed and evaluated in the same manner as in Example 1. The results are shown in Table 2. An enlarged photograph of the polishing surface of the obtained polishing pad is shown in FIG. 13. As a result of measuring the surface roughness of the land region in accordance with JIS B 0601:2001 and JIS B 0671:2002, using a surface roughness tester ("SURFTEST SJ-210" manufactured by Mitutoyo Corporation), the arithmetic mean roughness Ra was 0.2 μm, the maximum height Rz was 1.8 μm, and the reduced peak height Rpk was 0.4 μm. An enlarged photograph of the polishing surface of the polishing pad of Comparative Example 1 after polishing 10 wafers is shown in FIG. 14. It can be seen that the polishing surface repels water, and the pad surface is not in a condition sufficient to retain the slurry.

TABLE 2

| | Comparative Example No. | Com. Ex. 1 | Com. Ex. 2 | Com. Ex. 3 | Com. Ex. 4 | Com. Ex. 5 | Com. Ex. 6 | Com. Ex. 7 |
|---|---|---|---|---|---|---|---|---|
| | Polishing layer sheet | Prod. Ex. 1 | Prod. Ex. 1 | Prod. Ex. 1 | Prod. Ex. 2 | Prod. Ex. 2 | Prod. Ex. 2 | Prod. Ex. 2 |
| Deep-groove region | Depth (mm) | 1.0 | — | 1.0 | 0.8 | 0.8 | 0.8 | 0.8 |
| | Upper surface width (mm) | 0.7 | — | 0.7 | 1.5 | 1.5 | 1.5 | 2.0 |
| | Groove pitch (mm) | 9.0 | — | 4.5 | 7.0 | 7.0 | 7.0 | 7.0 |
| | First pattern | Spiral | — | Spiral | Spiral | Spiral | Spiral | Spiral |
| | Ratio of total projected area of deep-groove region (%) | 8 | — | 16 | 21 | 21 | 21 | 29 |

TABLE 2-continued

| | Comparative Example No. | Com. Ex. 1 | Com. Ex. 2 | Com. Ex. 3 | Com. Ex. 4 | Com. Ex. 5 | Com. Ex. 6 | Com. Ex. 7 |
|---|---|---|---|---|---|---|---|---|
| Land region | Depth of shallow recesses (mm) | — | 0.08 | 0.20 | — | 0.20 | 0.04 | 0.06 |
| | Upper surface width of shallow recesses (mm) | — | 1.0 | 1.0 | — | 1.0 | 2.0 | — |
| | Pitch of shallow recesses (mm) | — | 4.0 | 3.0 | — | 3.0 | 4.0 | 2.5 |
| | Second pattern | — | Triangular grid | Triangular grid | — | XY grid | Concentric | Hexagonal grid |
| | Shape of land portions | — | Equilateral triangle of side 3.0 mm | Equilateral triangle of side 1.9 mm | — | Square of side 2.0 mm | Toroidal (annular) | Sea around island-like hole |
| | Maximum distance of land portion (mm) | — | 3.0 | 1.9 | — | 2.8 | — | — |
| | Projected area of land portion (mm$^2$) | — | 3.9 | 1.5 | — | 4.0 | — | — |
| | Ratio of total projected area of land portions (%) | — | 42 | 30 | — | 44 | 50 | 42 |
| Polishing rate (nm/min) | 3rd | 79 | 100 | 131 | 88 | 118 | 60 | 103 |
| | 5th | 72 | 104 | 138 | 105 | 121 | 75 | 112 |
| | 10th | 65 | 108 | 147 | 117 | 134 | 90 | 122 |
| | 15th | 81 | 104 | 155 | 141 | 142 | 114 | 140 |
| | 25th | 131 | 95 | 161 | 162 | 152 | 138 | 157 |
| | 50th | 181 | 97 | 169 | 199 | 169 | 183 | 190 |
| | 100th | 194 | 89 | 183 | 216 | 186 | 198 | 206 |
| Accumulated conditioning time until shallow recesses become less than 0.01 mm (min) | | — | 25 | >100 | — | >100 | 51 | 46 |

Comparative Example 2

A polishing layer was produced in the same manner as in Example 1 except that the deep groove was not formed in Example 1. Then, using the obtained polishing layer, a polishing pad was formed and evaluated in the same manner as in Example 1. The results are shown in Table 2.

Comparative Example 3

A polishing layer was produced in the same manner as in Example 2 except that shallow recesses in the form of a triangular grid formed by a plurality of straight lines having a width of 1.0 mm, a depth of 0.20 mm, and a pitch of 3.0 mm were formed on the polishing surface, instead of forming shallow recesses in the form of a triangular grid formed by a plurality of straight lines having a width of 1.0 mm, a depth of 0.04 mm, and a pitch of 3.0 mm. The cross-sectional shape of the shallow recesses was rectangular. A large number of island-like, equilateral triangular land portions each having a length of one side of 1.9 mm that were surrounded by a large number of shallow recesses were formed on the polishing surface. The projected area of one island-like land portion was 1.5 mm$^2$, the maximum distance in the horizontal direction of one island-like land portion was 1.9 mm, and the ratio of the total projected area of the land portions to the overall projected area of the land region was 30%. In this manner, a polishing layer was produced.

Then, using the obtained polishing layer, a polishing pad was formed and evaluated in the same manner as in Example 1. The results are shown in Table 2.

Comparative Example 4

A polishing layer was produced in the same manner as in Example 8 except that the shallow recesses were not formed in Example 8. Then, using the obtained polishing layer, a polishing pad was formed and evaluated in the same manner as in Example 1. The results are shown in Table 2.

Comparative Example 5

A polishing layer was produced was produced in the same manner as in Example 9 except that shallow recesses in the form of an XY grid formed by a plurality of straight lines having a width of 1.0 mm, a depth of 0.20 mm, and a pitch of 3.0 mm were formed on the polishing surface, instead of forming shallow recesses in the form of a triangular grid formed by a plurality of straight lines having a width of 1.5 mm, a depth of 0.03 mm, and a pitch 6.0 mm. The cross-sectional shape of the shallow recesses was rectangular. A large number of island-like, square land portions each having a length of one side of 2.0 mm that were surrounded by a large number of shallow recesses were formed on the polishing surface. The projected area of one island-like land portion was 4.0 mm$^2$, the maximum distance in the horizontal direction of one island-like land portion was 2.8 mm, and the ratio of the total projected area of the land portions to the overall projected area of the land region was 44%. In this manner, a polishing layer was produced.

Then, using the obtained polishing layer, a polishing pad was formed and evaluated in the same manner as in Example 1. The results are shown in Table 2.

Comparative Example 6

A polishing layer was produced in the same manner as in Example 9 except that a plurality of concentric shallow recesses having a width of 2.0 mm, a depth of 0.04 mm, and a pitch of 4.0 mm were formed on the polishing surface, instead of forming shallow recesses in the form of a triangular grid formed by a plurality of straight lines having a width of 1.5 mm, a depth of 0.03 mm, and a pitch 6.0 mm. The cross-sectional shape of the shallow recesses was rectangular. The land portions between the shallow recesses were continuous concentrically rather than being continuous in the form of islands. The ratio of the total projected area of the land portions to the overall projected area of the land region was 50%. In this manner, a polishing layer was produced.

Then, using the obtained polishing layer, a polishing pad was formed and evaluated in the same manner as in Example 1. The results are shown in Table 2.

Comparative Example 7

A polishing layer was produced in the same manner as in Example 11 except that shallow recesses as described below were formed in Example 11, instead of forming shallow recesses with island-like, circular land portions having a diameter of 1.5 mm formed therebetween, by pressing an SUS punched plate against the polishing surface by hot pressing. Then, using the obtained polishing layer, a polishing pad was formed and evaluated in the same manner as in Example 1.

Circular shallow recesses having a diameter of 2 mm and a depth of 0.06 mm were formed by cutting so as to be in the form of a hexagonal grid at a center-to-center pitch of 2.5 mm. The cross-sectional shape of the shallow recesses is rectangular. The land portions between the shallow recesses were continuous in the form of seas in the form of a hexagonal grid, rather than in the form of islands. The ratio of the total projected area of the land portions to the overall projected area of the land region was 42%. The results are shown in Table 2.

From the results described above, the following can be understood.

The polishing pads of Examples 1 to 11, which included a deep groove or deep grooves having a depth of 0.3 mm or more, shallow recesses having a depth of 0.01 to 0.1 mm, and a plurality of island-like land portions surrounded by the shallow recesses and having a maximum distance in the horizontal direction of 8 mm or less, required a shorter time until the polishing rate was stabilized as compared with the polishing pads of Comparative Examples 1 and 4, which did not include the shallow recesses, and the polishing pads of Comparative Examples 6 and 7, which did not include the island-like land portions surrounded by the shallow recesses, and therefore successfully reduced the time for running-in polishing. Note that the polishing pads of Example 1 to 5 and 8 to 11, which included the island-like land portions having a maximum distance in the horizontal direction of 7 mm or less, achieved particularly significant effect of reducing the time for running-in polishing. The polishing pads of Comparative Examples 3 and 5, which included the shallow recesses having a depth exceeding 0.1 mm, had a relatively high polishing rate in the early stage of the use, but the polishing rate was difficult to be stabilized, so that the effect of reducing the time for running-in polishing was low. The polishing pad of Comparative Example 2, which did not include any deep groove, had a low polishing rate.

A polishing pad according to the present invention is useful in polishing applications for a semiconductor substrate, a glass, and the like. In particular, the polishing pad is suitably used when performing chemical mechanical polishing on substrate materials of a semiconductor, a hard disk, a liquid crystal display and the like, or optical components such as a lens and a mirror.

REFERENCE SIGNS LIST

1. . . . Deep groove or hole
2, 12, 22. . . . Shallow recess
3, 13. . . . Land portion
5. . . . Polishing layer
6. . . . Adhesion layer
7. . . . Cushioning layer
10, 20, 30, 40. . . . Polishing pad
50. . . . Base material to be polished
G. . . . Deep-groove region
L. . . . Land region
P. . . . Polishing surface

The invention claimed is:

1. A polishing pad, comprising:
a polishing layer having a polishing surface,
wherein the polishing surface includes a deep-groove region having a first pattern formed by a deep groove or hole having a depth of 0.3 mm or more, and a land region that is a region other than the deep-groove region,
the land region includes shallow recesses having a second pattern, a depth of 0.01 to 0.1 mm and a width of 0.5 to 4 mm, and a plurality of island-like land portions surrounded by the shallow recesses and having a maximum distance in a horizontal direction of 0.5 to 8 mm, and
wherein each of said depths is based on the depth on a polishing surface of an unused polishing pad which has not undergone a break-in treatment.

2. The polishing pad according to claim 1,
wherein the second pattern includes at least one pattern formed on the entire surface of the land region selected from the group consisting of a triangular grid pattern, a square grid pattern, a rectangular grid pattern, a diamond-shaped grid pattern, and a hexagonal grid pattern.

3. The polishing pad according to claim 2,
wherein the first pattern has a groove pitch of 1 to 15 mm and a groove width of 0.1 to 4 mm.

4. The polishing pad according to claim 2,
wherein the shallow recesses have a width of 1 to 2 mm and the first pattern has a groove pitch of 1 to 15 mm and a groove width of 0.1 to 4 mm.

5. The polishing pad according to claim 2,
wherein a projected area of each one of the land portions is in the range of 1.5 to 5 $mm^2$.

6. The polishing pad according to claim 1,
wherein a projected area of each one of the land portions is in the range of 0.3 to 10 $mm^2$.

7. The polishing pad according to claim 1,
wherein a ratio of a total projected area of the land portions to an overall projected area of the land region is 10 to 50%.

8. The polishing pad according to claim 1,
wherein the depth of the shallow recesses is 0.02 to 0.06 mm.

9. The polishing pad according to claim 1,
wherein a ratio of a projected area of the deep-groove region to an overall projected area of the polishing surface is 5 to 40%.

10. The polishing pad according to claim 1,
wherein the first pattern includes at least one pattern selected from the group consisting of a spiral pattern, a concentric pattern, and a grid pattern.

11. The polishing pad according to claim 1,
wherein the polishing layer is formed of a sheet composed mainly of a non-foamed polymer body.

12. The polishing pad according to claim 1,
wherein the polishing layer includes a thermoplastic polyurethane sheet.

13. A method for manufacturing the polishing pad according to claim 1, the method comprising:
preparing a polymer sheet for forming the polishing layer;
forming the deep-groove region on a side of the polymer sheet serving as a polishing surface; and
forming the land region on the side the polymer sheet serving as the polishing surface, wherein the shallow recesses are formed by cutting or transferring.

14. A polishing method for polishing a surface of a semiconductor device in a manufacturing process of the semiconductor device, the method comprising:
conditioning the polishing surface of the polishing pad according to claim 1 during a break-in of the polishing pad under conditions where, for an accumulated conditioning time of 30 minutes or less, an average depth of the shallow recesses with the depth of 0.01 to 0.1 mm becomes less than 0.01 mm to produce a broken-in polishing pad; and
polishing the surface of the semiconductor device using the broken-in polishing pad.

15. The polishing method according to claim 14, wherein the accumulated conditioning time is 1 to 20 minutes.

16. The polishing pad according to claim 1, wherein the shallow recesses have a width of 1 to 2 mm.

17. The polishing pad according to claim 1, wherein the first pattern has a groove pitch of 1 to 15 mm and a groove width of 0.1 to 4 mm.

18. The polishing pad according to claim 1, wherein the shallow recesses have a width of 1 to 2 mm and the first pattern has a groove pitch of 1 to 15 mm and a groove width of 0.1 to 4 mm.

19. The polishing pad according to claim 1, wherein a projected area of each one of the land portions is in the range of 1.5 to 5 mm$^2$.

20. The polishing pad according to claim 1, wherein:
the first pattern includes at least one pattern selected from the group consisting of a spiral pattern, a concentric pattern, and a grid pattern, and
the second pattern includes at least one pattern formed on the entire surface of the land region selected from the group consisting of a triangular grid pattern, a square grid pattern, a rectangular grid pattern, a diamond-shaped grid pattern, and a hexagonal grid pattern.

* * * * *